(12) United States Patent
Li et al.

(10) Patent No.: US 8,083,958 B2
(45) Date of Patent: Dec. 27, 2011

(54) PATTERNING METHOD USING A COMBINATION OF PHOTOLITHOGRAPHY AND COPOLYMER SELF-ASSEMBLYING LITHOGRAPHY TECHNIQUES

(75) Inventors: Wai-Kin Li, Beacon, NY (US); Haining S. Yang, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1055 days.

(21) Appl. No.: 11/950,600

(22) Filed: Dec. 5, 2007

(65) Prior Publication Data
US 2009/0148795 A1    Jun. 11, 2009

(51) Int. Cl.
*B82Y 40/00*  (2011.01)
*H01L 21/302* (2006.01)

(52) U.S. Cl. ............ 216/41; 216/17; 216/47; 216/49; 438/694; 438/700; 438/942; 438/947; 977/888; 977/895

(58) Field of Classification Search .............. None
See application file for complete search history.

(56) References Cited

U.S. PATENT DOCUMENTS

| | | | |
|---|---|---|---|
| 6,746,825 B2 | 6/2004 | Nealey et al. | |
| 7,429,536 B2 * | 9/2008 | Abatchev et al. | 438/725 |
| 7,553,760 B2 * | 6/2009 | Yang et al. | 438/637 |
| 7,651,735 B2 * | 1/2010 | Cheng et al. | 427/256 |
| 7,696,085 B2 * | 4/2010 | Li et al. | 438/626 |
| 7,723,009 B2 * | 5/2010 | Sandhu et al. | 430/270.1 |
| 7,892,940 B2 * | 2/2011 | Edelstein et al. | 438/421 |
| 2004/0195202 A1 * | 10/2004 | Pechenik | 216/2 |
| 2007/0224823 A1 * | 9/2007 | Sandhu | 438/694 |
| 2008/0103256 A1 * | 5/2008 | Kim et al. | 525/88 |
| 2008/0176767 A1 * | 7/2008 | Millward | 506/20 |
| 2008/0233323 A1 * | 9/2008 | Cheng et al. | 428/36.91 |
| 2009/0311363 A1 * | 12/2009 | Dobisz et al. | 425/470 |

OTHER PUBLICATIONS

Nealey, et al., "Self-Assembling Resists for Nanolithography," IEEE, 2005, pp. 1-4, Electron Devices Meeting, 2005. IEDM Technical Digest, IEEE Intl., Dec. 2005.
Pending U.S. Appl. No. 11/424,963 "Sub-Lithographic Feature Patterning Using Self-Aligned Self-Assembly Polymers", filed Jun. 19, 2006, Yang, et al.
Pending U.S. Appl. No. 11/538,550 "Sub-Lithographic Local Interconnects, and Methods for Forming Same", filed Oct. 4, 2006, Yang, et al.
Pending U.S. Appl. No. 11/552,641 "Sub-Lithographic Gate Length Transistor Using Self-Assembling Polymers", filed Oct. 25, 2006, Yang, et al.
Pending U.S. Appl. No. 11/627,488 "Sub-Lithographic Interconnect Patterning Using Self-Assembling Polymers", filed Jan. 26, 2007, Yang, et al.

* cited by examiner

*Primary Examiner* — Anita Alanko
(74) *Attorney, Agent, or Firm* — Gibb I.P. Law Firm, LLC; Yuanmin Cai, Esq.

(57) ABSTRACT

Disclosed are embodiments of a lithographic patterning method that incorporates a combination of photolithography and self-assembling copolymer lithography techniques in order to create, on a substrate, a grid-pattern mask having multiple cells, each with at least one sub-50 nm dimension. The combination of different lithographic techniques further allows for precise registration and overlay of the individual grid-pattern cells with corresponding structures within the substrate. The resulting grid-pattern mask can then be used, in conjunction with directional etch and other processes, to extend the cell patterns into the substrate and, thereby form openings, with at least one sub-50 nm dimension, landing on corresponding in-substrate structures. Once the openings are formed, additional structures can be formed within the openings.

24 Claims, 18 Drawing Sheets

PATTERNING METHOD USING A COMBINATION OF PHOTOLITHOGRAPHY AND COPOLYMER SELF-ASSEMBLYING LITHOGRAPHY TECHNIQUES

BACKGROUND

1. Field of the Invention

The embodiments of the invention generally relate to lithographic patterning of semiconductor wafers and, more particularly, to a method for lithographically patterning semiconductor wafers using a combination of photolithographic and copolymer self-assembling lithographic techniques.

2. Description of the Related Art

Currently, in the field of lithographic patterning conventional photolithographic techniques can only be used to achieve feature dimensions in the 70-100 nm range. To overcome the limitations of conventional photolithographic techniques, self-assembling copolymer lithographic techniques were developed that can be used to form useful periodic patterns with molecular dimensions in the 20-40 nm range (e.g., see "Self-assembling resists for nanolithography" by Nealey et al., Electron Devices Meeting, 2005. IEDM Technical Digest, IEEE International, December 2005 and U.S. Pat. No. 6,746,825 of Nealy et al. issued on Jun. 8, 2004, which are incorporated herein by reference). Self-assembling copolymer lithographic techniques generally include using exposure tools to define a periodic chemical pattern in a substrate such that adjacent sections of the substrate have contrasting chemical functionalities and dimensions of less than 40 nm. This can be accomplished because, while imaging materials are only able to resolve patterns in the 70-100 nm range, exposure tools are able to resolve patterns having dimensions of 20 nm or even less. Next, a copolymer mixture is applied to the substrate surface and then annealed. During the anneal process, different block polymers interact differently with the contrasting chemical functionalities in the substrate such that they are re-arranged to form a regular periodic pattern of discrete block polymer sections that are registered with and perpendicular to the periodic chemical pattern in the substrate. Different block polymer sections can be selectively removed, thereby creating a developed pattern that can subsequently be transferred into the substrate. This self-assembly copolymer lithographic technique has been used to create uniform periodic patterns with molecular dimensions over very large surface areas, e.g., in order to form magnetic domains for hard drive disks.

Unfortunately, this self-assembly copolymer technique is currently not suitable for use in next generation complementary metal oxide semiconductor (CMOS) technology because of the need for precise registration and overlay capabilities. Specifically, 45/32 nm node CMOS technology requires sub-50 nm metal contacts in order to connect transistors to back end of the line (BEOL) wiring. However, current 0.93NA photolithography tools can only print patterns that can be used to form 100 nm contacts. Furthermore, next generation photolithograph tools (e.g., 1.2NA immersion photolithography tools) are only expected to print patterns that can be used to form 70-80 nm contacts. These larger contact sizes (e.g., 70 nm or greater) contribute to a lower than desirable device density on each chip. Thus, there is a need in the art for a technique for printing patterns that can be used to form structures (e.g., contacts, interconnects, device components, etc.), having less than 50 nm dimensions, on semiconductor wafers. However, the technique must also be able provide precise registration and overlay capabilities to ensure exact placement of the sub-50 nm structures relative to the position of one or more previously formed structures within the wafer substrate.

SUMMARY

In view of the foregoing, disclosed herein are embodiments of a lithographic patterning method that incorporates a combination of photolithography and self-assembling copolymer lithography techniques in order to create a grid-pattern mask having multiple cells, each with at least one sub-50 nm dimension.

Each of the embodiments of the method comprises providing a substrate and a structure in the substrate. Next, multiple hardmask layers are formed on the substrate.

In one embodiment of the method, after the hardmask layers are formed, multiple lithographic processes and etching processes are performed, over the multiple hardmask layers, in order to create a grid-pattern mask having multiple cells. The multiple lithographic processes are tailored to ensure that one of the cells is precisely aligned above the structure. Furthermore, at least one of the multiple lithographic processes comprises a self-assembling copolymer lithographic technique.

In another embodiment of the method, after the hardmask layers are formed, at least three lithographic processes and multiple etching processes are performed, over the multiple hardmask layers, in order to create a grid-pattern mask having multiple cells. The three lithographic processes are tailored to ensure that one of the cells is aligned above the structure. Furthermore, at least two of the three lithographic processes comprise self-assembling copolymer lithographic processes.

In yet another embodiment of the method, after the hardmask layers are formed, a first lithographic process is performed in order to remove a portion of a first hardmask layer so as to expose a portion of a second hardmask layer and to define a limited area of the substrate that includes the structure. Then, a second lithographic process is performed in order to form, on an exposed portion of the second hardmask layer above the limited area, a first mask portion oriented in a first direction. After the second lithographic process is performed, a directional etch process is performed so as to form, through the exposed portion of the second hardmask layer to the substrate, elongated trenches oriented in the first direction and having a first dimension. Next, a third lithographic process is performed in order to form, in the trenches and across the first mask portion, a second mask portion oriented in a second direction perpendicular to the first direction, thereby creating a grid-pattern mask having multiple cells, each with the first dimension and a second dimension. In this method embodiment, the first, second and third lithographic processes are tailored to ensure that one of the cells is aligned above the structure. Furthermore, the second and third lithographic processes comprise self-assembling copolymer lithographic processes.

Another embodiment of the method comprises, after the hardmask layers are formed, performing a first lithographic process to remove a portion of a first hardmask layer in order to define a limited area of the substrate that includes the structure. Next, a second lithographic process is performed in order to form a first mask portion above the limited area and oriented in a first direction. Then, a third lithographic process is performed in order to form a second mask portion above the limited area and oriented in a second direction perpendicular to the first direction, thereby creating a grid-pattern mask having multiple cells. The first, second and third lithographic processes are tailored to ensure that one of the cells is aligned with the structure. The second lithographic process comprises a self-assembling copolymer lithographic process tailored so that each of the cells has a first dimension that is less than approximately 50 nm. Finally, the third lithographic process comprises a photolithographic process tailored to ensure that each of the cells has a second dimension that is greater than the first dimension (i.e., greater than 50 nm).

Yet another embodiment of the method comprises, after forming the hardmask layers, performing a first lithographic process to remove a portion of a first hardmask layer in order to expose a portion of a second hardmask layer and to define a limited area of the substrate that includes the structure. Next, a second lithographic process is performed in order to form, on an exposed portion of the second hardmask layer above the limited area, a first mask portion oriented in a first direction. This second lithographic process comprises a self-assembling copolymer lithographic process. Next, a directional etch process is performed so as to form, through the exposed portion of the second hardmask layer to a third hardmask layer, elongated trenches oriented in the first direction. Then, the first mask portion is selectively removed. Once the first mask portion is removed, a third lithographic process is performed in order to form, in the trenches and on the second hardmask layer, a second mask portion oriented in a second direction perpendicular to the first direction, thereby creating a grid-pattern mask having multiple cells. The first, second and third lithographic processes are tailored to ensure that one of the cells is aligned above the structure. The second lithographic process comprises a self-assembling copolymer lithographic process tailored to ensure that each of the cells has a first dimension that is less than 50 nm. Finally, the third lithographic process comprises a photolithographic process tailored to ensure that each of the cells has a second dimension that is greater than the first dimension.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
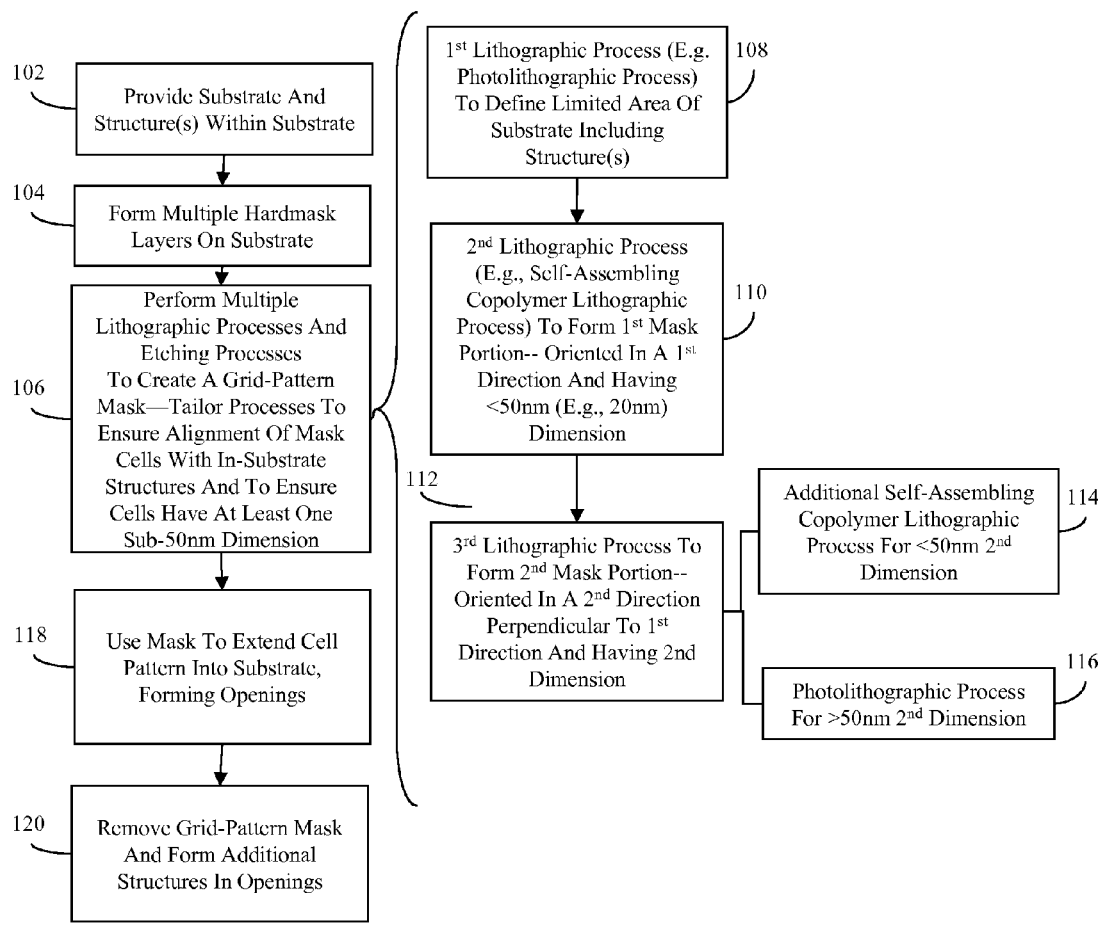
FIG. 1 is a flow diagram illustrating an embodiment of a lithographic patterning method.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Device size scaling is an ongoing goal in the semiconductor industry and sub-50 nm feature dimensions are desirable for next generation complementary metal oxide semiconductor (CMOS) devices. Unfortunately, as discussed above, it is anticipated that next generation photolithographic techniques will only be able to achieve feature dimensions in the 70-100 nm range. Furthermore, while self-assembly copolymer lithographic techniques can be used to create patterns with molecular dimensions, they do not have precise overlay and registration capabilities, required to ensure that feature match-up. Thus, current lithographic patterning techniques are not suitable for achieving the sub-50 nm feature dimensions required for next generation CMOS technology.

In view of the foregoing, disclosed herein are embodiments of a lithographic patterning method that incorporates a combination of photolithography and self-assembling copolymer lithography techniques in order to create a grid-pattern mask having multiple cells, each with at least one sub-50 nm dimension. The combination of different lithographic techniques further allows for precise registration and overlay of individual grid-pattern cells with corresponding structures within an underlying substrate. The resulting grid-pattern mask can then be used, in conjunction with directional etch and other processes, to extend the cell patterns into the substrate forming openings, with at least one sub-50 nm dimension, that land precisely on corresponding in-substrate structures. Once the openings are formed, additional structures can be formed within the openings. For example, in one embodiment the in-substrate structures can comprise device components (e.g., transistor source/drain regions, transistor gates, etc.) and the openings can be used to form contacts on those device components. In another embodiment, the in-substrate structures can comprise contacts and the openings can be used to form wire interconnects on those contacts. In yet another embodiment, the in-substrate structures can comprise transistor channel regions and the openings can be used to form polysilicon gates on those channel regions.

Referring to the flow diagram of FIG. 1, the disclosed method embodiments comprise providing a substrate and one or more structures within the substrate (102). Multiple hardmask layers are formed on the substrate (104). Then, multiple lithographic processes and etching processes are performed, over the multiple hardmask layers, in order to create a grid-pattern mask having multiple cells (106).

The multiple lithographic processes are tailored to ensure that at least one of the cells in the grid-pattern mask is precisely aligned with a corresponding in-substrate structure and further to ensure that at least one dimension of each cell in the grid-pattern mask is less than approximately 50 nm (e.g., is approximately 20 nm dimension). Specifically, a first lithographic process, comprising a photolithographic process, can be performed to remove a portion of the outermost hardmask layer and, thereby to define a limited area of the substrate that includes one or more in-substrate structures (108). Next, a second lithographic process, comprising a self-assembling copolymer lithographic process, can be performed in order to form, above the defined limited area of the substrate, a first mask portion that it is oriented in a first direction (110). This self-assembling copolymer lithographic process can be tailored to define a first dimension of each cell in a grid-pattern mask (e.g., a cell width) that will be formed within the defined limited area. More specifically, this self-assembling copolymer lithographic process can be tailored to define the first dimension of each cell in the grid-pattern mask as less than 50 nm (e.g., as approximately 20 nm). After the second lithographic process is completed, a third lithographic process can be performed so as to form, above the defined limited area of the substrate, a second mask portion oriented in a second direction perpendicular to the first direction. This third lithographic process can be tailored to define a second dimension of each cell in the grid-pattern mask (e.g., a cell length) (112).

Figure 2:
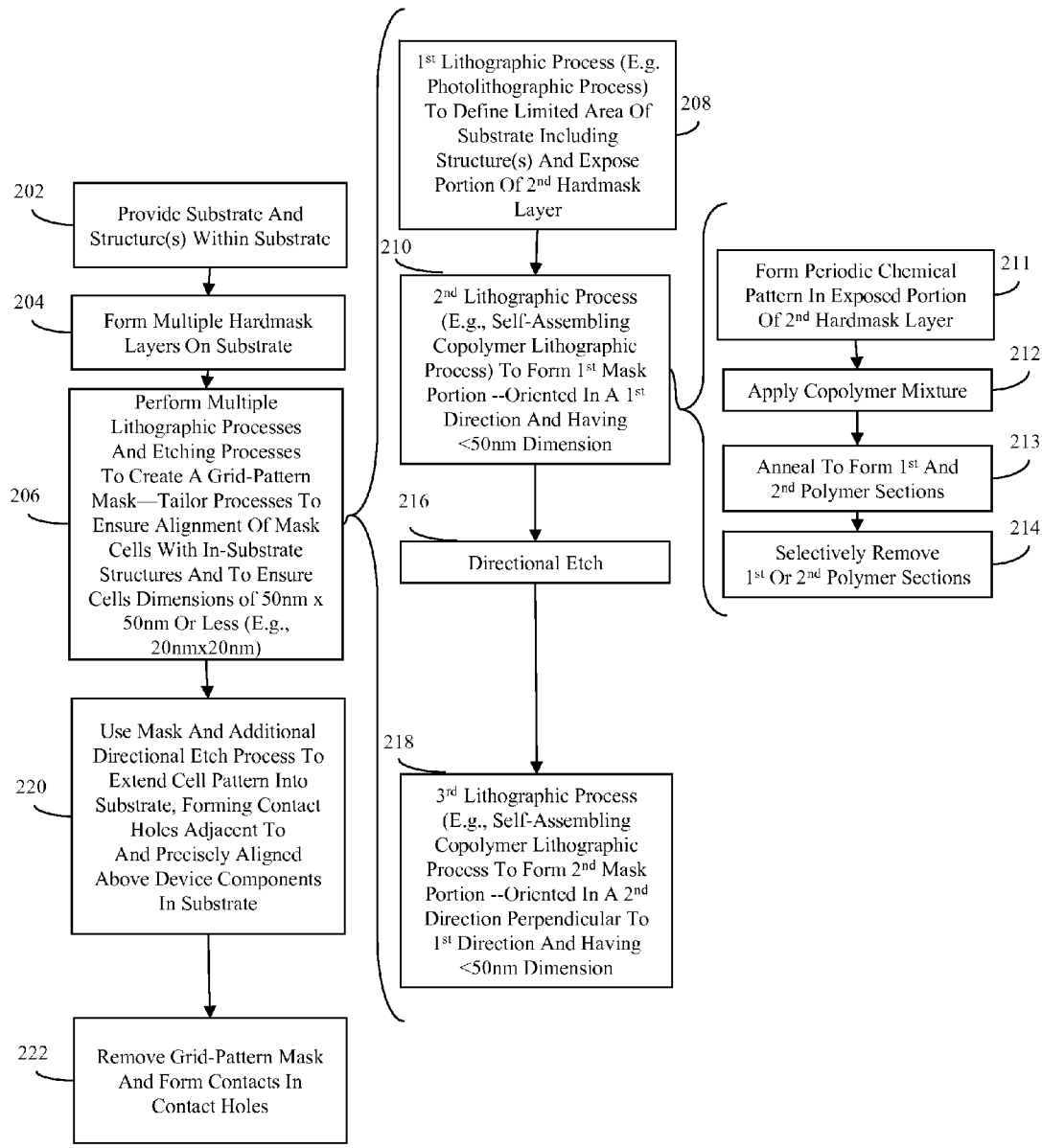
FIG. 2 is a flow diagram illustrating another embodiment of a lithographic patterning method.
Figure 17:
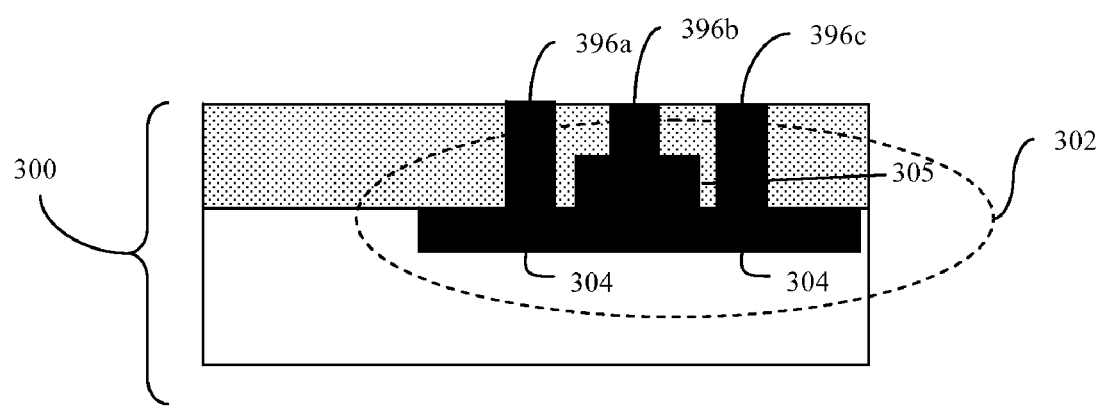
FIG. 17 is a cross-section diagram of a semiconductor wafer illustrating a process in the method of FIG. 2.

In one embodiment of the lithographic patterning method of the present invention, the third lithographic process can comprise an additional self-assembling copolymer lithographic process tailored to ensure that each cell has a second dimension (i.e., a cell length) that is also less than approximately 50 nm (e.g., that is approximately 20 nm) (114, see FIG. 2 and detailed discussion below). In another embodiment of the lithographic patterning method of the present invention, the third lithographic process can comprise a photolithographic process tailored to ensure that each cell has a second dimension (i.e., a cell length) that is greater than the sub-50 nm first dimension (e.g., is approximately 70 nm) such that each cell has an elongated rectangular-shape (116, see FIG. 17 and detailed discussion below). In either embodiment, the second and third lithographic processes in combination are used to create a grid-pattern mask with the desired cell dimensions. It should be noted that in addition to defining cell dimensions, the second and third lithographic processes are also tailored to ensure that, within the limited area of the substrate defined by the first lithographic process, at least one specific cell of the grid-pattern mask is precisely aligned in both the first and second directions above a corresponding specific structure in the substrate.

After the multiple lithographic patterning and etching steps are performed at process 106, the resulting grid-pattern mask can be used, in conjunction with directional etch and other processes, to extend the cell patterns into the substrate forming openings adjacent to and precisely aligned above corresponding in-substrate structures (118). Given the technique used to form the grid-pattern mask and the directional etch, the resulting openings will have the same dimensions as the cells and will further land precisely on their corresponding in-substrate structures. Finally, after the openings are formed, additional structures can be formed within the openings (120). For example, a grid-pattern mask with cells having dimensions of less than 50 nm by 50 nm can be used to form contact holes for 45/32 nm node CMOS technology, which requires sub-50 nm metal contacts to connect filed effect transistor (FET) components (e.g., gates, source/drain regions, etc.) or other device components to back end of the line (BEOL) wiring. Whereas, a grid-pattern mask with elongated rectangular shaped cells, having a sub-50 nm width, can be used to form openings for future generations of CMOS technologies, which may require sub-50 nm features, such as wire interconnects, polysilicon gates, etc.

As mentioned above, the flow diagram of FIG. 2 illustrates a specific embodiment of the lithographic patterning method of the present invention that can be used to create a grid-pattern mask having multiple cells with dimensions that are less than 50 nm by 50 nm. This grid-pattern mask can in turn be used to form contact holes through a substrate in, for example, 45/32 nm node CMOS technology, where precisely aligned sub-50 nm metal contacts are required to connect FET components (e.g., gates, source/drain regions, etc.) or other device components to BEOL wiring.

Figure 3:
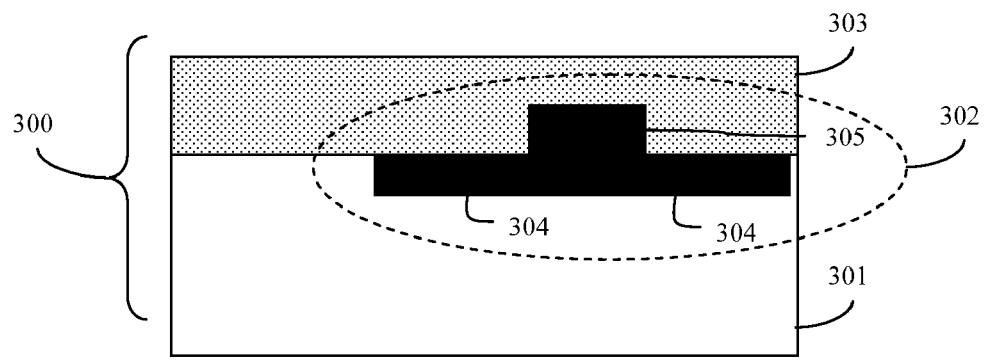
FIG. 3 is a cross-section diagram of a semiconductor wafer illustrating a process in the method of FIG. 2.

This embodiment comprises providing a substrate 300 and one or more structures 304-305 within the substrate 300 (202, see FIG. 3). Specifically, the substrate 300 can comprise a semiconductor wafer 301, such as a bulk silicon or silicon-on-insulator (SOI) wafer; one or more devices 302 (e.g., FETs, diodes, etc.) formed on the semiconductor wafer 301; and an interlayer dielectric 303 covering the devices 302. The in-substrate structures 304-305 can comprise components of a device 302 (e.g., source/drain regions or gates of FETs) that require a contact and, more particularly, require a sub-50 nm contact to a back end of the line (BEOL) wiring layer.

Figure 4:
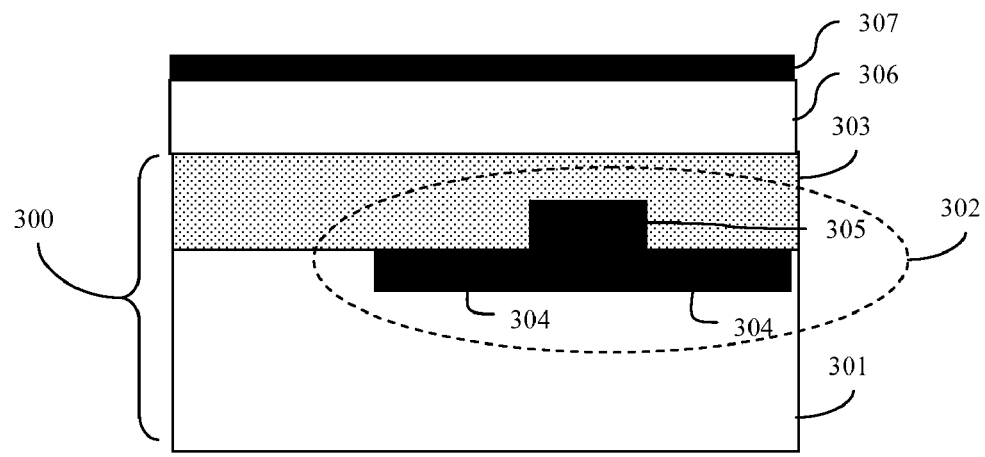
FIG. 4 is a cross-section diagram of a semiconductor wafer illustrating another process in the method of FIG. 2.

Next, multiple hardmask layers 306-307 are stacked on the substrate 300 (204, see FIG. 4). Specifically, a second hardmask layer 306 can be formed (e.g., deposited) on the interlayer dielectric 303 and a first hardmask layer 307 (i.e., an outermost hardmask layer) can be formed (e.g., deposited) on the second hardmask layer 306. These multiple hardmask layers 306-307 can comprise different dielectric layers such that they can be selectively etched (e.g., a nitride layer on an oxide layer).

Figure 14:
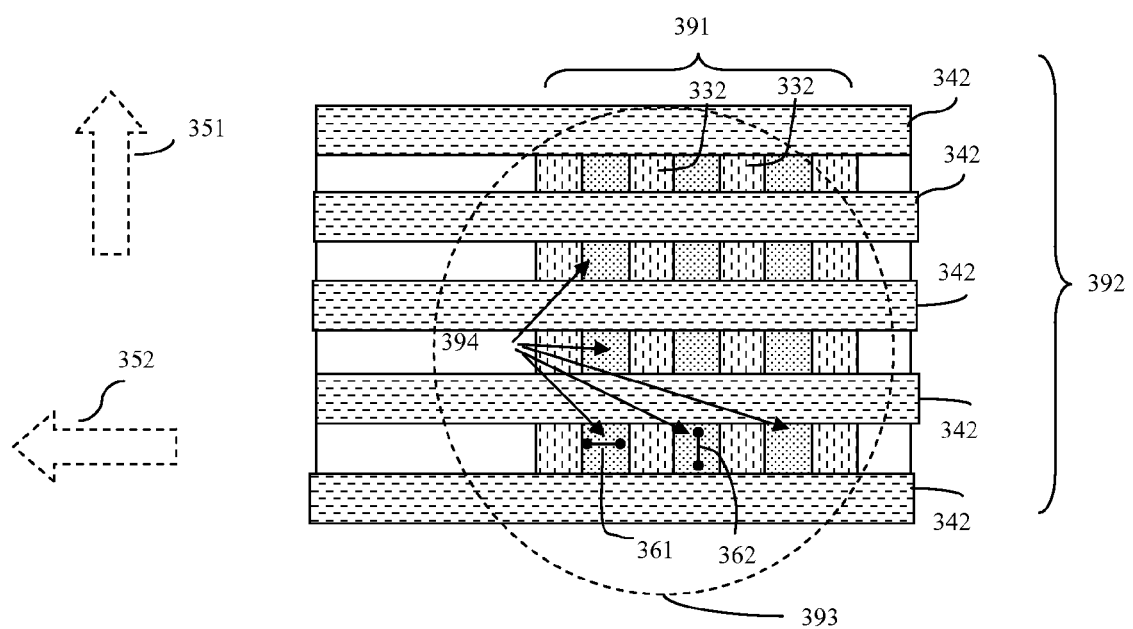
FIG. 14 is a top view diagram of a semiconductor wafer illustrating another process in the method of FIG. 2.

Then, multiple lithographic processes and etching processes are performed, over the multiple hardmask layers 306-307, in order to create a grid-pattern mask 393 having multiple cells 394 (206, see FIG. 14). The multiple lithographic processes are tailored to ensure that at least one of the cells in the grid-pattern mask is precisely aligned with a corresponding in-substrate structure. Additionally, in this particular embodiment at least two of the lithographic processes comprise self-assembling copolymer lithographic processes that are tailored to ensure that each of the cells in the grid-pattern mask has dimensions that are less than approximately 50 nm by 50 nm (e.g., that are approximately 20 nm by 20 nm) (208-218). Thus, the cells 394 in the grid-pattern mask 393 of FIG. 14 can be used to form contact holes with the same sub-50 nm dimensions (220, e.g., see contact holes 395a-c of FIG. 16) and, thereby sub-50 nm contacts through the substrate and landing precisely on corresponding in-substrate structures (222, e.g., see contacts 396a-c of FIG. 17).

Figure 5:
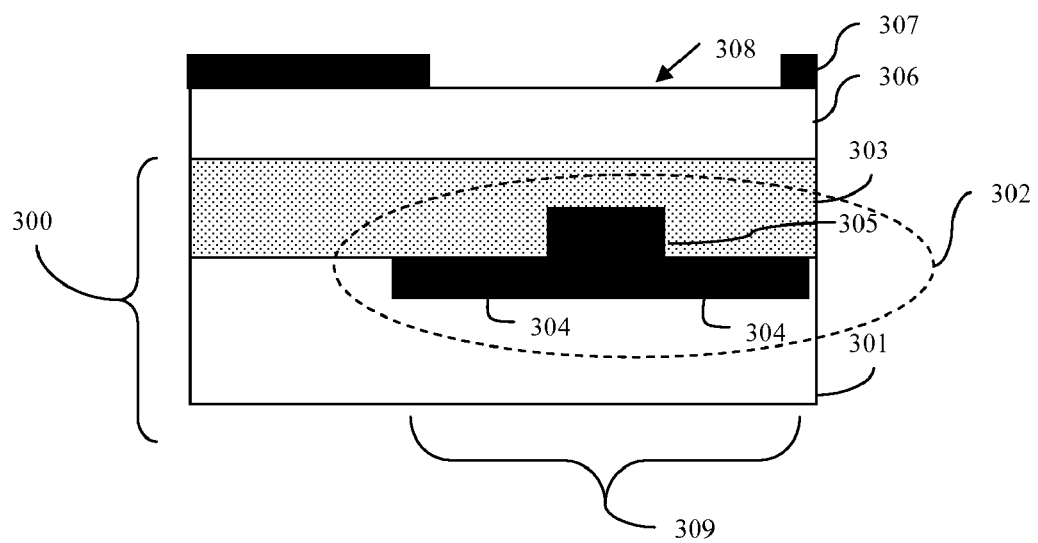
FIG. 5 is a cross-section diagram of a semiconductor wafer illustrating another process in the method of FIG. 2.

In this particular embodiment, the multiple lithographic processes can comprise at least three separate and distinct lithographic processes. A first lithographic process can be performed to remove a portion of the outermost hardmask layer 307 (i.e., the first hardmask layer) and, thereby to define a limited area 309 of the substrate 300 that includes one or more in-substrate structures (e.g., that includes FET components 304-305 of FET 303) (208, see FIG. 5). This first lithographic process can comprise a conventional photolithographic process that exposes a portion 308 of the second hardmask layer 306.

Next, a second lithographic process can be performed in order to form, above the defined limited area 309 of the substrate 303, a first mask portion 391 that it is oriented in a first direction 351 (210, see FIGS. 6-13). Specifically, this second lithographic process can comprise a self-assembling copolymer lithographic process (e.g., as described in U.S. Pat. No. 6,746,825 and incorporated by reference above). This self-assembling copolymer lithographic process can be tailored to define a first dimension of each cell (e.g., a cell width) of a grid-pattern mask as less than 50 nm (e.g., as approximately 20 nm).

Figure 6:
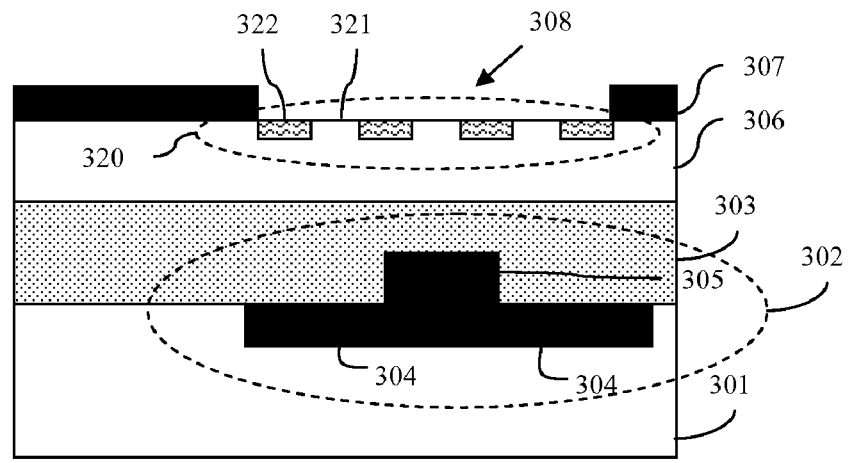
FIG. 6 is a cross-section diagram of a semiconductor wafer illustrating another process in the method of FIG. 2.
Figure 7:
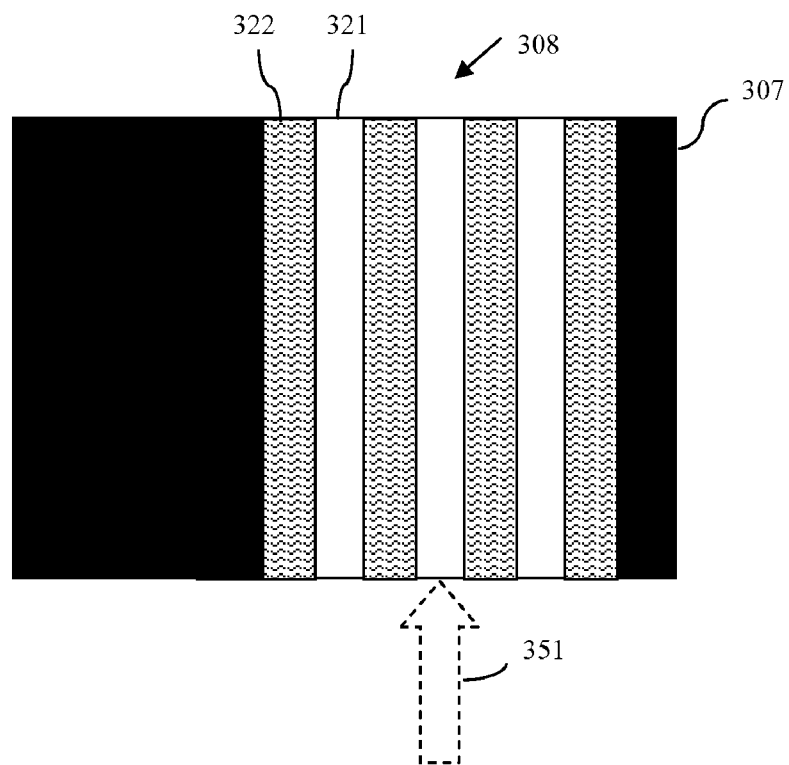
FIG. 7 is a top view diagram of the semiconductor wafer of FIG. 6.
Figure 8:
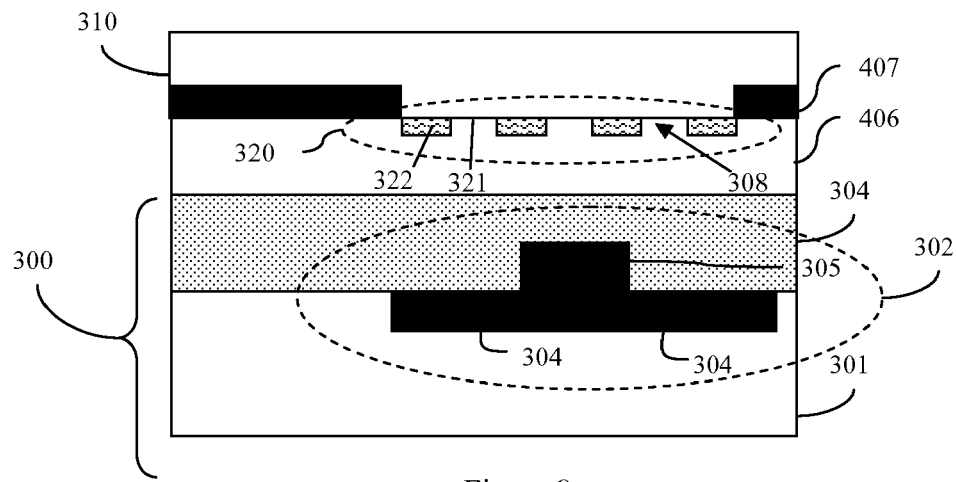
FIG. 8 is a cross-section diagram of a semiconductor wafer illustrating another process in the method of FIG. 2.
Figure 9:
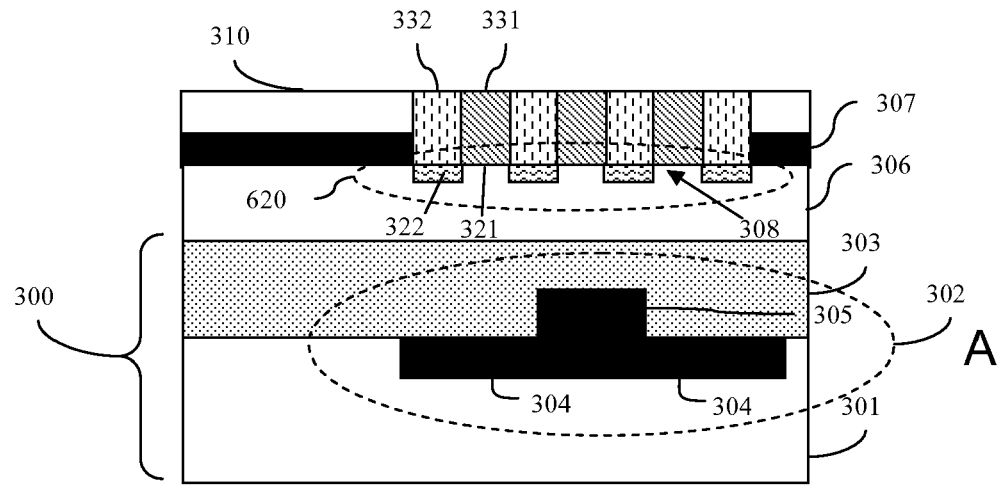
FIG. 9 is a cross-section diagram of a semiconductor wafer illustrating another process in the method of FIG. 2.
Figure 10:
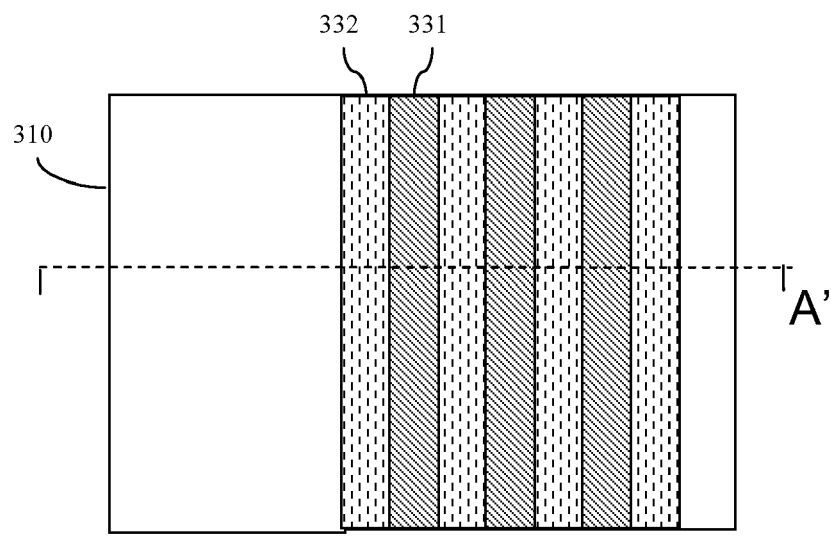
FIG. 10 is a top view diagram of the semiconductor wafer of FIG. 9.
Figure 11:
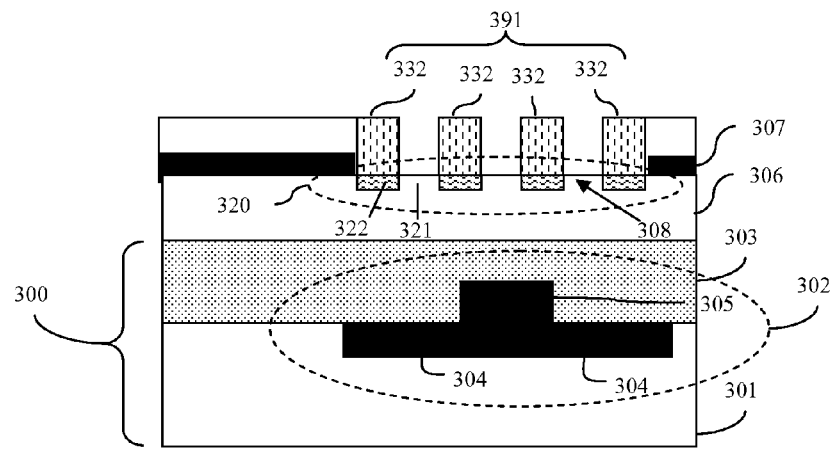
FIG. 11 is a cross-section diagram of a semiconductor wafer illustrating another process in the method of FIG. 2.

More specifically, this self-assembling copolymer lithographic process can comprise forming a periodic chemical pattern 320 on the exposed portion 308 of the second hardmask layer 306 (211, see FIGS. 6 and 7 in combination). The chemical pattern 320 is formed such that adjacent sections 321, 322 of the exposed portion 308 of the second hardmask layer 306 have contrasting chemical functionalities and further such that the chemical pattern is oriented in a first direction 351. This chemical pattern 320 can be formed, for example, using known exposure tools capable of resolving patterns having dimensions of 50 nm or even less. Next, a copolymer mixture 310 (e.g., a mixture of polystyrene (PS) and poly(methylmethacrylate) (PMMA) or any other suitable block polymer materials) is applied to the exposed portion 308 of the second hardmask layer 306 (212, see FIG. 8). Then, an anneal is performed creating a periodic lamellar pattern of first polymer sections 331 and second polymer sections 332 that are registered with and perpendicular to the periodic chemical pattern 320 (213, see FIGS. 9-10 in combination). Those skilled in the art will recognize that the patterns generated by the anneal will depend upon the mass ratio of the block polymers used in the mixture (at process 212). In this case alternating two-dimensional lamellae are desired; therefore, the copolymer mixture 310 should comprise symmetric block polymers having a 50:50 ratio. For example, if the copolymer mixture 310 that is applied (at process 212) comprises such a ratio of PS and PMMA block polymers, a lamellar pattern will be formed that comprises PS sections 331 above chemical pattern sections 321 and PMMA sections 332 above chemical pattern sections 322. Next, either the first polymer sections 331 (as shown) or the second polymer sections 332 are selectively removed, thereby forming the first mask portion 391 comprising remaining sections 321 (214, see FIG. 11). The selection of which sections (331 or 332) to remove is determined based on alignment over the in-substrate structure(s) 304, 305.

Figure 12:
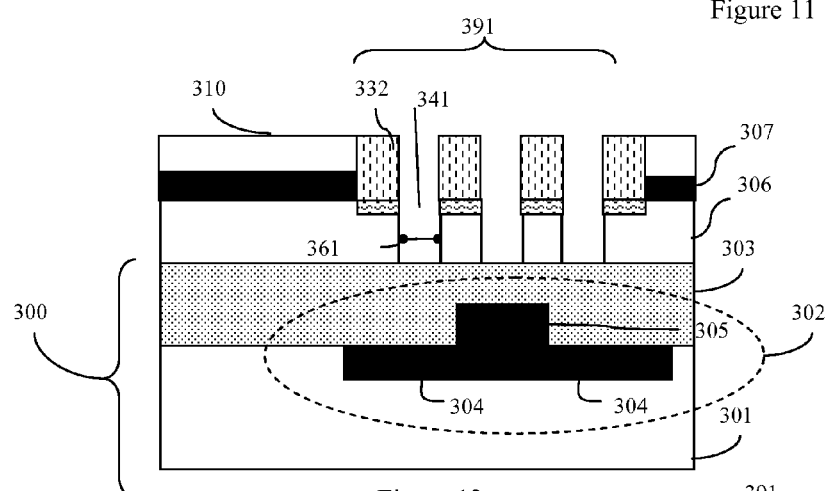
FIG. 12 is a cross-section diagram of a semiconductor wafer illustrating another process in the method of FIG. 2.
Figure 13:
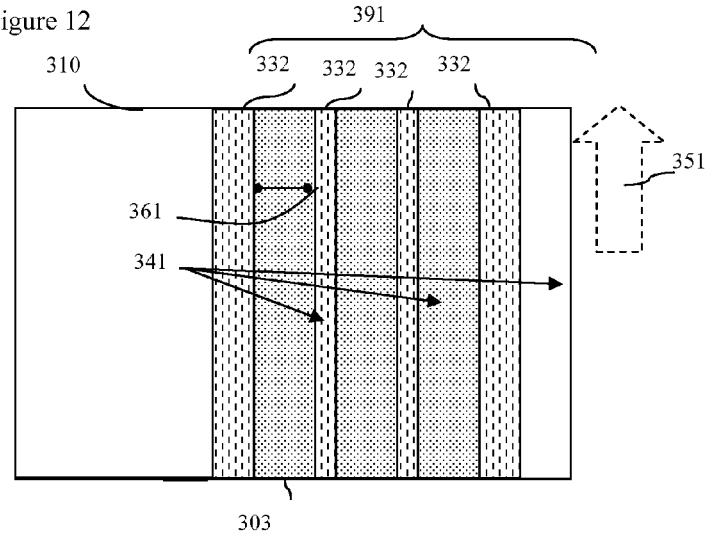
FIG. 13 is a top view diagram of the semiconductor wafer of FIG. 12.

After the first mask portion 391 is formed, a directional etch process can be performed so as to form, through the exposed portion 308 of the second hardmask layer 306 to the top surface of the substrate 300 (i.e., to dielectric layer 303), elongated trenches 341 oriented in the first direction 351 and having a first dimension 361 (216, see FIGS. 12-13 in combination). Due to the directional etch process, the first dimension 361 is the same as the thickness as the polymer sections 331 that were previously removed at process 214 and, therefore, also the same as the thickness of chemical pattern sections 321 that were formed at process 211. Ultimately, this first dimension 361 will also correspond to the cell width for each cell in the grid-pattern mask created through process 206.

After the second lithographic process is completed and the directional etch is performed, a third lithographic process can be performed so as to form, above the defined limited area 309 of the substrate 300, a second mask portion 392 oriented in a second direction 352 perpendicular to the first direction 351, thereby forming a grid-pattern mask 393 having multiple cells 394 (218, see FIG. 14). This third lithographic process can be tailored to define a second dimension 362 of each cell 394 (e.g., a cell length) in the grid-pattern mask 393. In particular, this third lithographic process can comprise an additional self-assembling copolymer lithographic process tailored to ensure that each cell 394 has a second dimension 362 (i.e., a cell length) that is also less than approximately 50 nm (e.g., approximately 20 nm). The additional self-assembling copolymer lithographic process can be performed in the same manner, as described above (at process 210), except that the chemical pattern should be oriented in the opposite direction 652. That is, a chemical pattern is formed with contrasting chemical functionalities and oriented in the second direction 352 perpendicular to the first direction 651. Next, a copolymer mixture (e.g., a mixture of polystyrene (PS) and poly(methylmethacrylate) (PMMA)) is applied and an anneal is performed creating a periodic pattern of first and second polymer sections. Then, either the first or the second polymer sections are selectively removed, thereby forming the second mask portion 392 comprising remaining polymer sections 342 which traverse polymer sections 332 of first mask portion 391. The selection of which polymer sections to remove is again determined based on alignment over the in-substrate structure(s) 304, 305.

Figure 15:
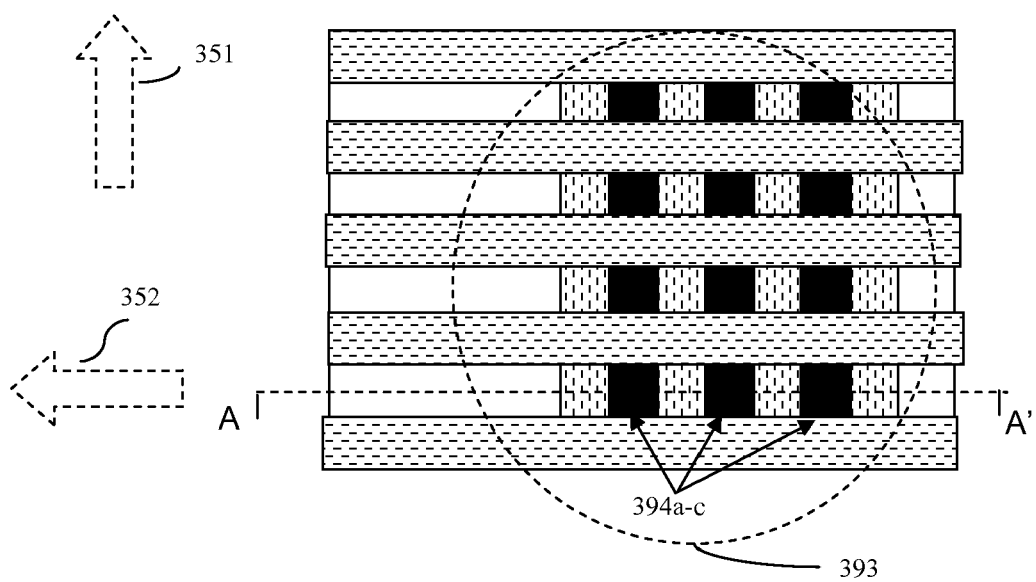
FIG. 15 is a top view diagram of a semiconductor wafer illustrating another process in the method of FIG. 2.
Figure 16:
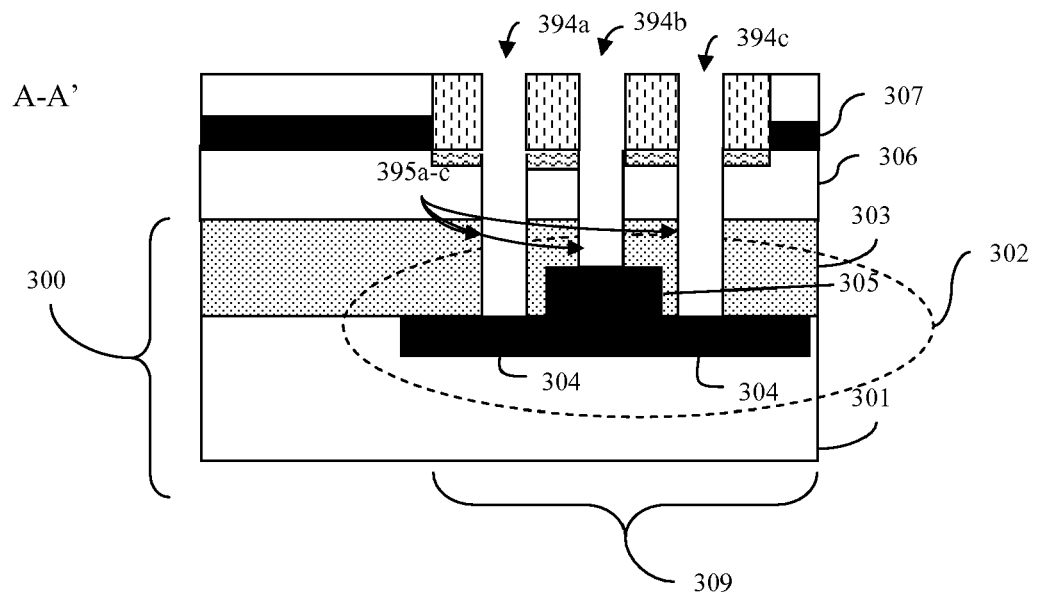
FIG. 16 is a cross-section diagram A-A' of the semiconductor wafer of FIG. 15.

After the grid-pattern mask is completed, an additional directional etch process can be performed so as to transfer the pattern of the cells (e.g., see cells 394a-c) into the substrate 300 (i.e., through dielectric layer 303), thus forming the contact holes 395a-c that extend through the substrate 300 and land precisely on the in-substrate structures 304, 305 (220, see FIGS. 15-16). Again, it should be noted that in addition to defining cell dimensions 361 and 362, the second and third lithographic processes (see process 210-218, discussed above) are tailored to ensure that the cells 394 are precisely aligned in the first and second directions 351-352 above in-substrate structures. That is, the second and third lithographic processes 210-218 are also tailored to ensure that at least one specific cell of the grid-pattern mask is precisely aligned in both the first and second directions above a corresponding specific structure in the substrate. For example, as illustrated in FIGS. 15 and 16, cell 394a can be aligned directly above one source/drain region 304 of FET 302, cell 394c can be aligned directly above another source/drain region 304 of FET 302 and cell 394b can be aligned directly above gate 305 of FET 302. Thus, following the additional directional etch (at process 216), the resulting contact holes 395a-c land directly on the source/drain regions 304 and gate 305. Such precise alignment is made possible because the second and third lithographic processes are confined within the limited area 309 of the substrate 300 that is defined by the first lithographic process 208. Once the contact holes are formed, the grid-pattern mask 393 and hardmask layers 306-307 can be removed and contacts 396a-c can be formed in the contact holes (222).

Figure 18:
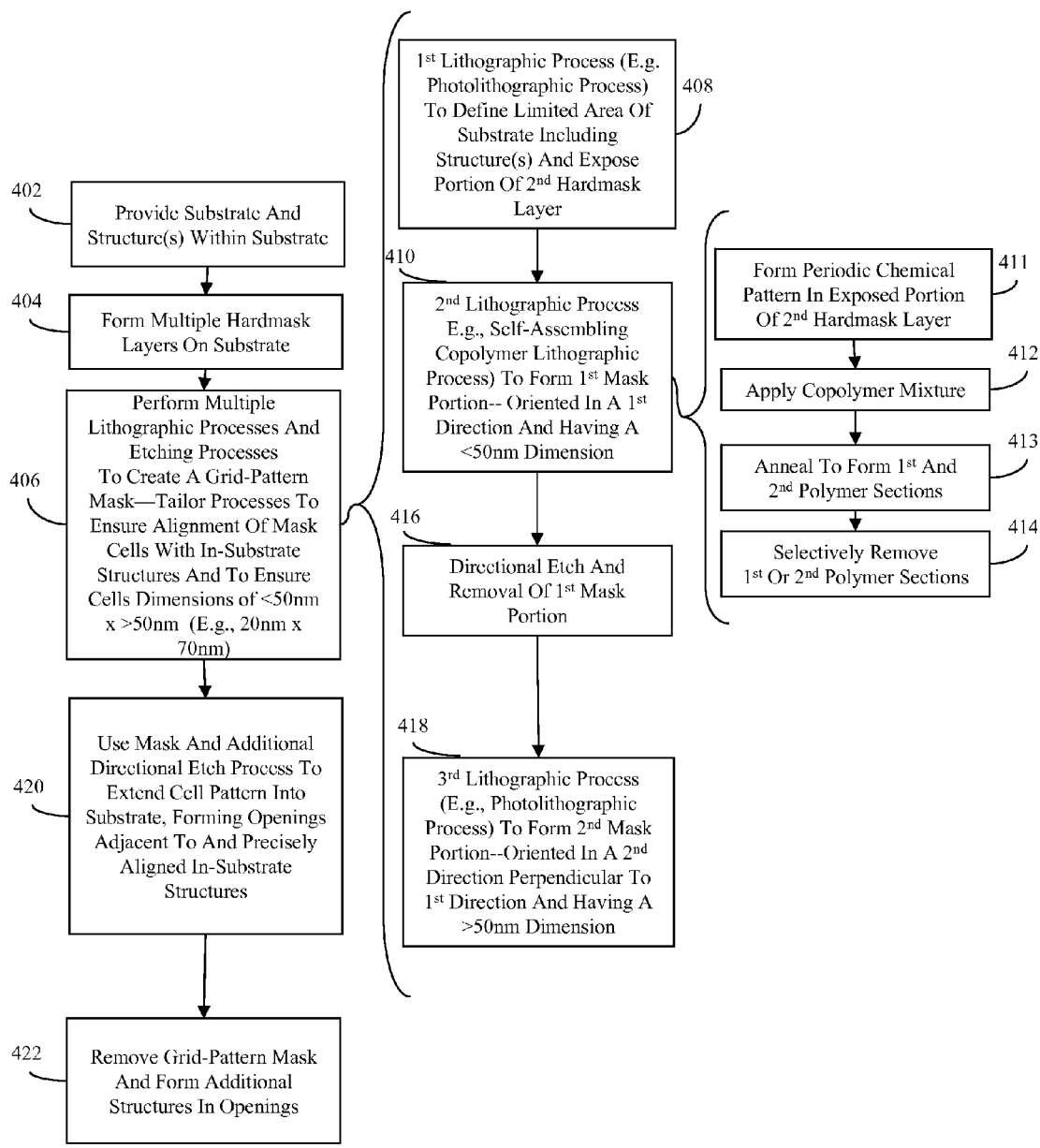
FIG. 18 is a flow diagram illustrating another embodiment of a lithographic patterning method.

Also as mentioned above, the flow diagram of FIG. 18 illustrates a specific embodiment of the lithographic patterning method of the present invention that can be used to create a grid-mask having multiple cells, where each cell has a cell width (i.e., a first dimension) that is less than 50 nm (e.g., that is approximately 20 nm) and a cell length (i.e., a second dimensions) that is greater than 50 nm (e.g., that is approximately 70 nm). The cells in the grid-pattern mask can be used to form elongated rectangular-shaped openings in a substrate that in turn can be used to form elongated rectangular-shaped structures adjacent to (i.e., landing on) in-substrate structures. For example, the cells can be used to form openings for future generations of CMOS technologies, which may require sub-50 nm features, such as wire interconnects adjacent to contact, polysilicon gates adjacent to transistor channel regions, etc.

Figure 19:
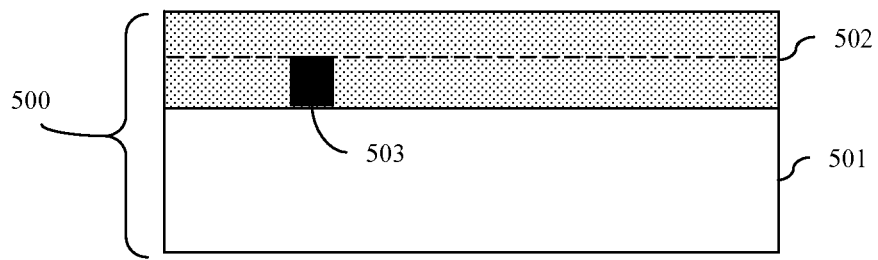
FIG. 19 is a cross-section diagram of a semiconductor wafer illustrating a process in the method of FIG. 18.

The embodiment comprises providing a substrate 500 and one or more structures 503 within the substrate (402, see FIG. 19). Specifically, the substrate 500 can comprise a semiconductor wafer 501, such as a bulk silicon or silicon-on-insulator (SOI) wafer; one or more structures 503 formed on the semiconductor wafer 501; and at least one interlayer dielectric 502 covering the structure 503. The in-substrate structure 503 can comprise a contact 50 requiring a sub-50 nm wire interconnect (as illustrated). Alternatively, the in-substrate structure can comprise a FET channel region that requires a sub-50 nm polysilicon gate conductor.

Figure 20:
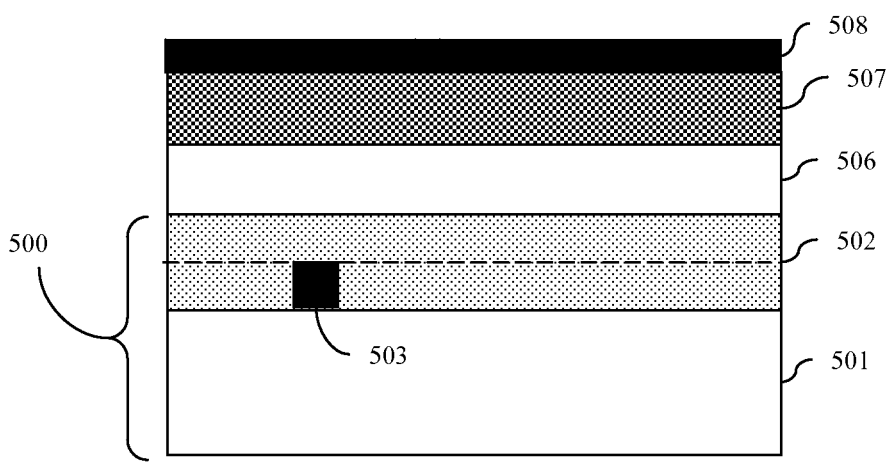
FIG. 20 is a cross-section diagram of a semiconductor wafer illustrating another process in the method of FIG. 18.

Next, multiple hardmask layers 506-508 are formed on the substrate 500 (404, see FIG. 20). These multiple hardmask layers 506-507 can comprise different dielectric layers such that they can be selectively etched (e.g., alternating nitride and oxide layers).

Figure 30:
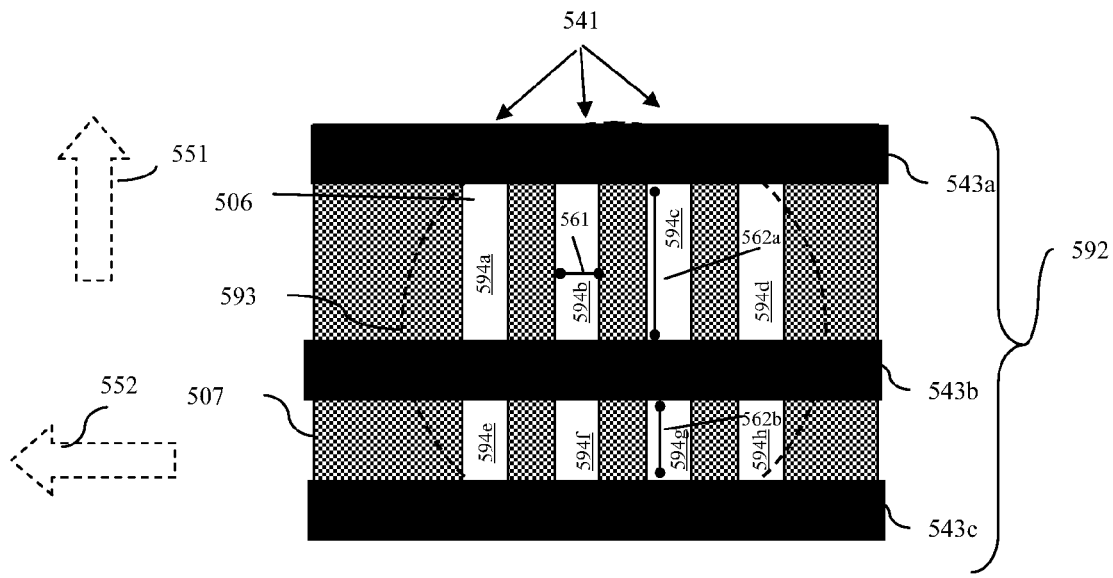
FIG. 30 is a top view diagram of a semiconductor wafer illustrating another process in the method of FIG. 18.

Then, multiple lithographic processes and etching processes are performed, over the multiple hardmask layers 506-508, in order to create a grid-pattern mask 593 having multiple cells 594 (406, see FIG. 30). The multiple lithographic processes are tailored to ensure that at least one of the cells 594a-h in the grid-pattern mask is precisely aligned with a corresponding in-substrate structure. Additionally, in this particular embodiment, one of the lithographic processes comprises a self-assembling copolymer lithographic process tailored so that each of the cells in the grid-pattern mask has a first dimension (e.g., a cell width) that is less than approximately 50 nm and another of the lithographic processes comprises a photolithographic process tailored to ensure that each of the cells in the grid-pattern mask has a second dimension (e.g., a cell length) that is greater than the first dimension (i.e., is greater than 50 nm) (408-418). Thus, the cells in the grid-pattern mask 593 of FIG. 30 can be used to form openings through the substrate 500 to corresponding in-substrate structures such that each opening is rectangular in shape with one dimension (e.g., a cell width) being less than 50 nm and one dimension (e.g., a cell length) being greater than 50 nm (420, e.g., see cell 594a used to form opening 595a landing on structure 503 in FIGS. 32 and 33) and, thereby, to form additional structures (e.g., wire interconnects, polysilicon gates, etc., as necessary) within the openings such that the additional structures are precisely aligned with the corresponding in-substrate structures (422, e.g., see structure 596 on structure 503 in FIG. 34).

Figure 21:
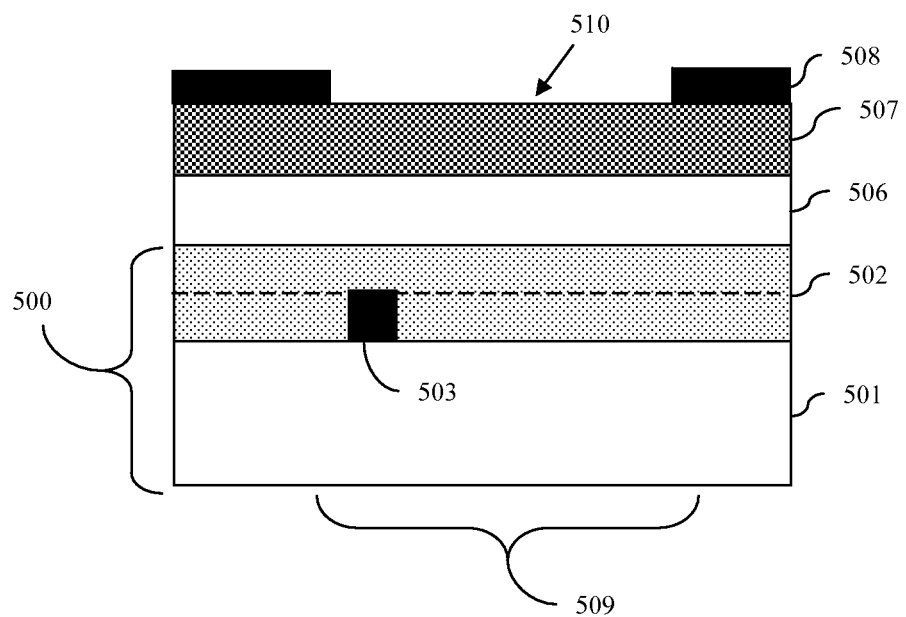
FIG. 21 is a cross-section diagram of a semiconductor wafer illustrating another process in the method of FIG. 18.

In this particular embodiment, the multiple lithographic processes can also comprise at least three separate and distinct lithographic processes. A first lithographic process can be performed to remove a portion of an outermost hardmask layer 508 (i.e., the first hardmask layer) and, thereby to define a limited area 509 of the substrate 500 that includes one or more in-substrate structures 503 (408, see FIG. 21). This first lithographic process can comprise a conventional photolithographic process that exposes a portion 510 of a second hardmask layer 507.

Next, a second lithographic process can be performed in order to form, above the defined limited area 509 of the substrate 500, a first mask portion 591 that it is oriented in a first direction 551 (410, see FIGS. 22-27). This second lithographic process can comprise a self-assembling copolymer lithographic process (e.g., as described in U.S. Pat. No. 6,746,825 incorporated by reference above) tailored to define a first dimension of each cell (e.g., a cell width) of a grid-pattern mask as less than 50 nm (e.g., approximately 20 nm).

Figure 22:
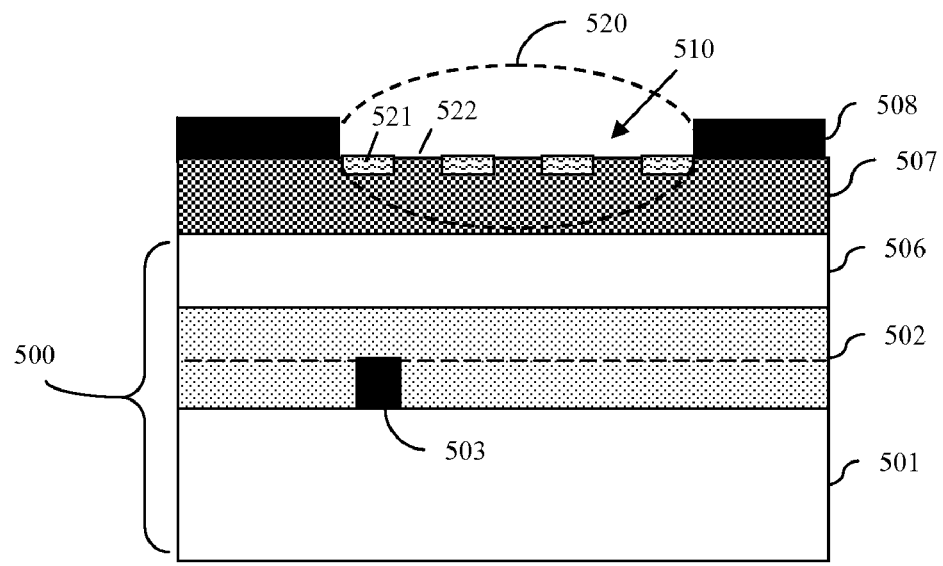
FIG. 22 is a cross-section diagram of a semiconductor wafer illustrating another process in the method of FIG. 18.
Figure 23:
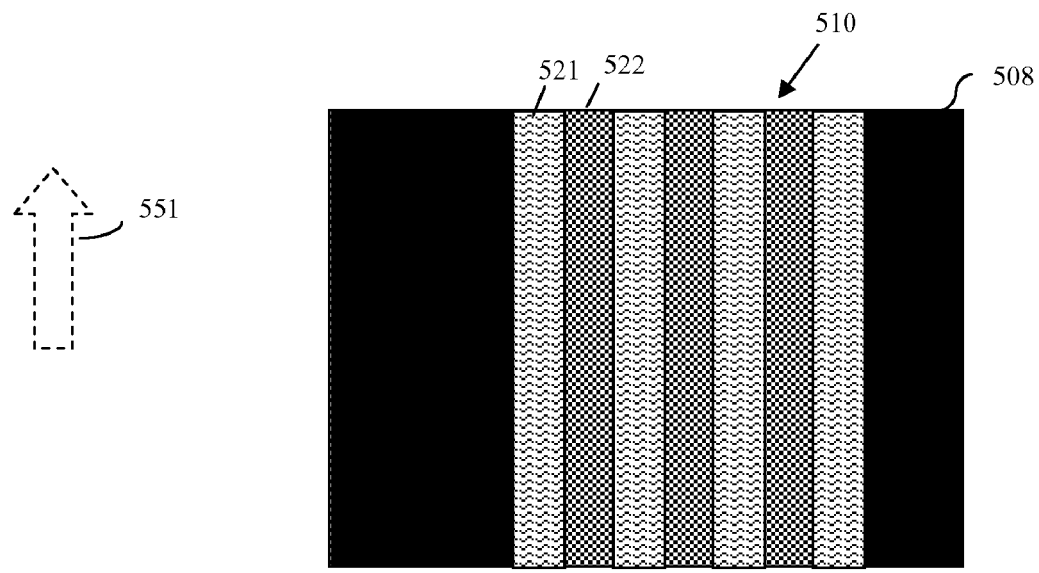
FIG. 23 is a top view diagram of the semiconductor of FIG. 22.
Figure 24:
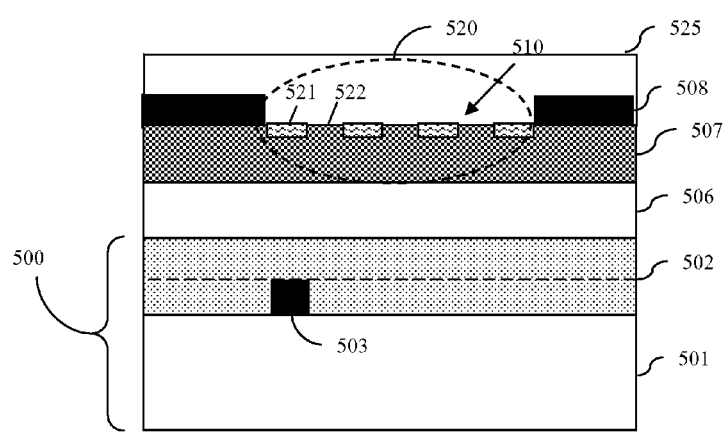
FIG. 24 is a cross-section diagram of a semiconductor wafer illustrating another process in the method of FIG. 18.
Figure 25:
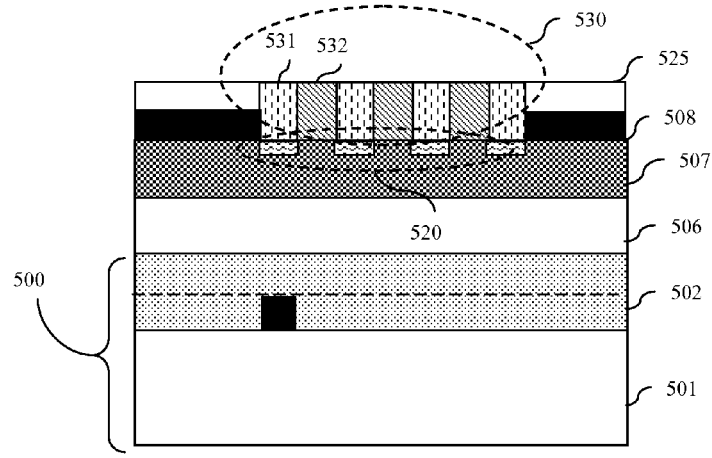
FIG. 25 is a cross-section diagram of a semiconductor wafer illustrating another process in the method of FIG. 18.
Figure 26:
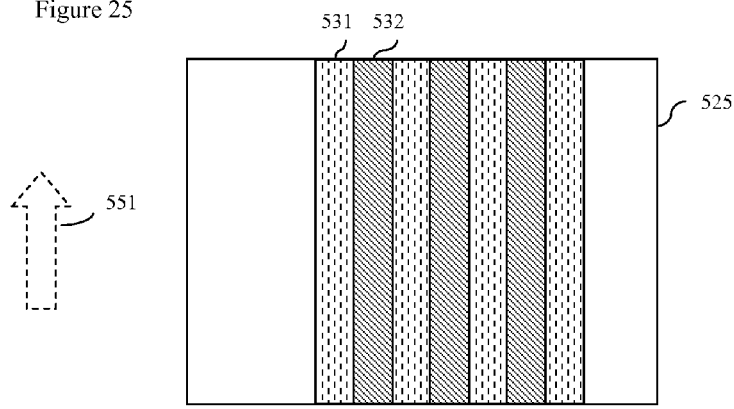
FIG. 26 is a top view diagram of the semiconductor wafer of FIG. 25.
Figure 27:
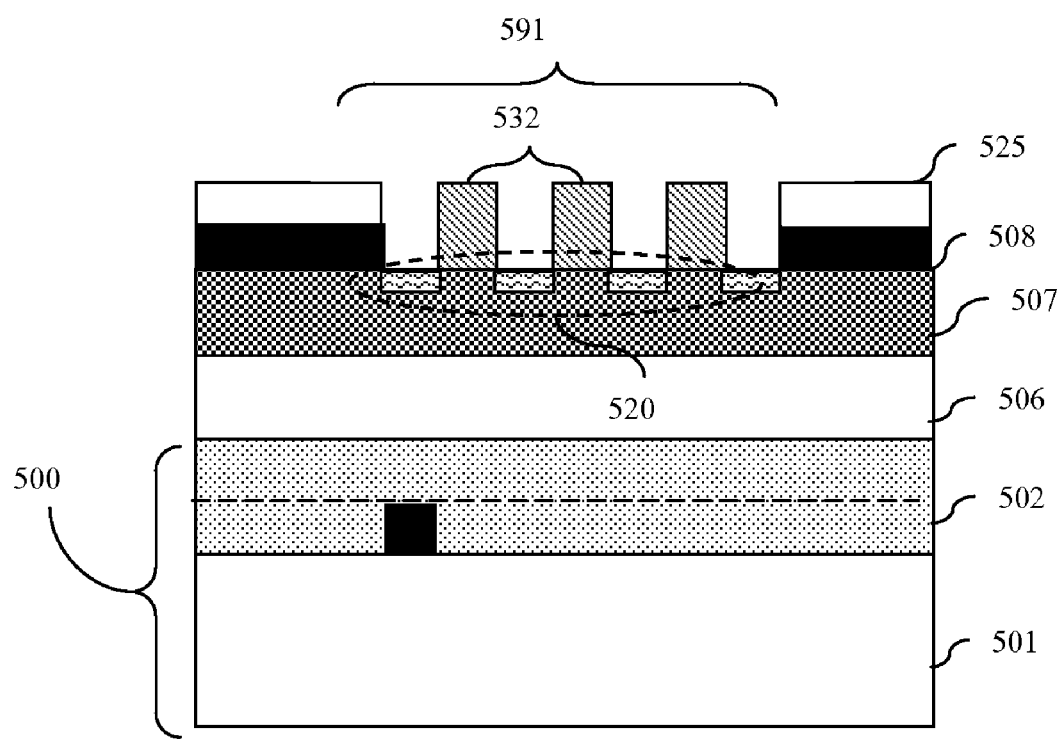
FIG. 27 is a cross-section diagram of a semiconductor wafer illustrating another process in the method of FIG. 18.

More specifically, the self-assembling copolymer lithographic process 410 can comprise forming a periodic chemical pattern 520 on the exposed portion 510 of the second hardmask layer 507 (411, see FIGS. 22-23 in combination). The chemical pattern 620 is formed such that adjacent sections 521, 522 of the exposed portion 510 of the second hardmask layer 507 have contrasting chemical functionalities and further such that the chemical pattern 620 is oriented in a first direction 551. This chemical pattern 320 can be formed, for example, using known exposure tools capable of resolving patterns having dimensions of 50 nm or even less. Next, a copolymer mixture 525 (e.g., a mixture of polystyrene (PS) and poly(methylmethacrylate) (PMMA) or any other suitable block polymer materials) is applied to the exposed portion 510 of the second hardmask layer 507 (412, see FIG. 24). Then, an anneal is performed creating a periodic lamellar pattern 530 of first polymer sections 531 and second polymer sections 532 that are registered with and perpendicular to the periodic chemical pattern 520 (413, see FIGS. 24-25 in combination). Those skilled in the art will recognize that the patterns generated will depend upon the mass ratio of the block polymers used. In this case alternating two-dimensional lamellae are desired; therefore, the copolymer mixture 525 should comprise symmetric block polymers having a 50:50 ratio. For example, if the copolymer mixture 525 should comprise such a ratio of PS and PMMA, a lamellar pattern will be formed that comprises PS sections 531 above chemical pattern sections 521 and PMMA sections 532 above chemical pattern sections 522. Next, either the first polymer sections 531 (as shown) or the second polymer sections 532 are selectively removed, thereby forming the first mask portion 591 comprising the remaining polymer section 532 (414, see FIG. 27). The selection of which sections (531 or 532) to remove is determined based on alignment over the in-substrate structure(s) 503.

Figure 28:
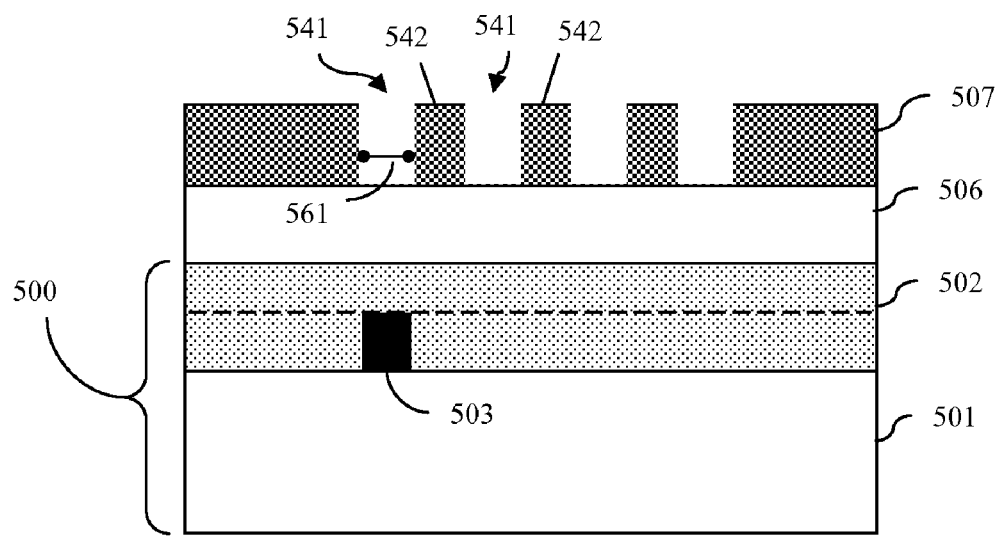
FIG. 28 is a cross-section diagram of a semiconductor wafer illustrating another process in the method of FIG. 18.
Figure 29:
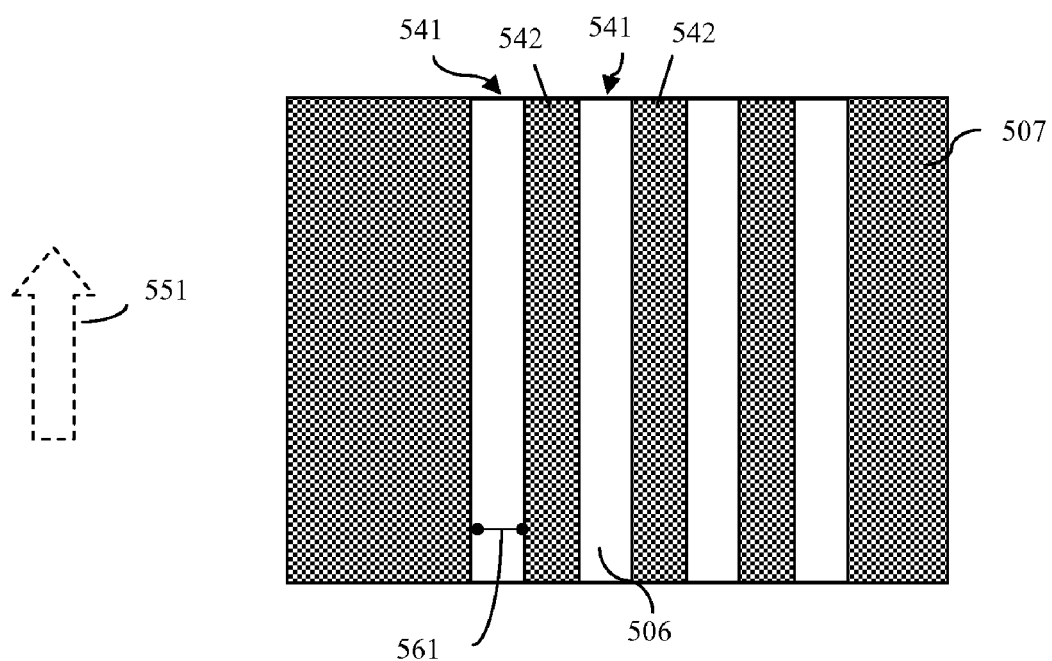
FIG. 29 is a top view diagram of the semiconductor wafer of FIG. 28.

Next, a directional etch process is performed in order to transfer the pattern of the first mask portion 591 into the second hardmask layer 507. That is, a directional etch process is performed in order to etch elongated trenches through the exposed portion 510 of the second hardmask layer 507 to a third hardmask layer 506. The elongated trenches 541 are oriented in the first direction 541 and separated by discrete sections 542 of the second hardmask layer 507. Once the directional etch process is performed and the elongated trenches 541 are formed in the second hardmask layer 507, the first mask portion 591 and any remaining portions of the first hardmask layer 508 and copolymer mixture 525 are selectively removed (416, see FIGS. 28-29 in combination).

Then, a third lithographic process, comprising an additional photolithographic process, can be performed so as to form a second mask portion 592 oriented in a second direction 552, which is perpendicular to the first direction 551 of the trenches 241 (418, see FIG. 30). Specifically, this additional photolithographic process can comprise depositing and patterning a photoresist layer into sections (e.g., see photoresist layer sections 543a-c). such that each section traverses the trenches 241 (i.e., is positioned within the trenches as well as extends over the second hardmask layer sections 242 between the trenches 241). This additional photolithographic process can be tailored to define a second dimension of each cell (e.g., cell length) in the grid-pattern mask 593. In particular, this third lithographic process can be tailored to ensure that each of the cells 594 has a second dimension 562 that is greater than the sub-50 nm first dimension (i.e., has a cell length that is greater than the sub-50 nm cell width) and, thus, such that each of the cells 594 has an elongated rectangular shape. For example, the first dimension 561 of a cell 594a can be defined by the self-assembling copolymer lithographic process as approximately 20 nm and the second dimension 562 of the cells 594 can be defined by this additional photolithographic process as approximately 70 nm. It should be noted that the second mask portion 592 may be formed (at process 418) such that the cells 594 of the resulting grid-pattern mask cells 595 are uniform in size and shape. Alternatively, the second mask portion 592 may be formed (at process 418) such that the cells 594 of the resulting grid-pattern mask 595 vary in length between the rows on the grid pattern, e.g., as illustrated in FIG. 30 (e.g., see different cell lengths 262a and 262b).

Figure 31:
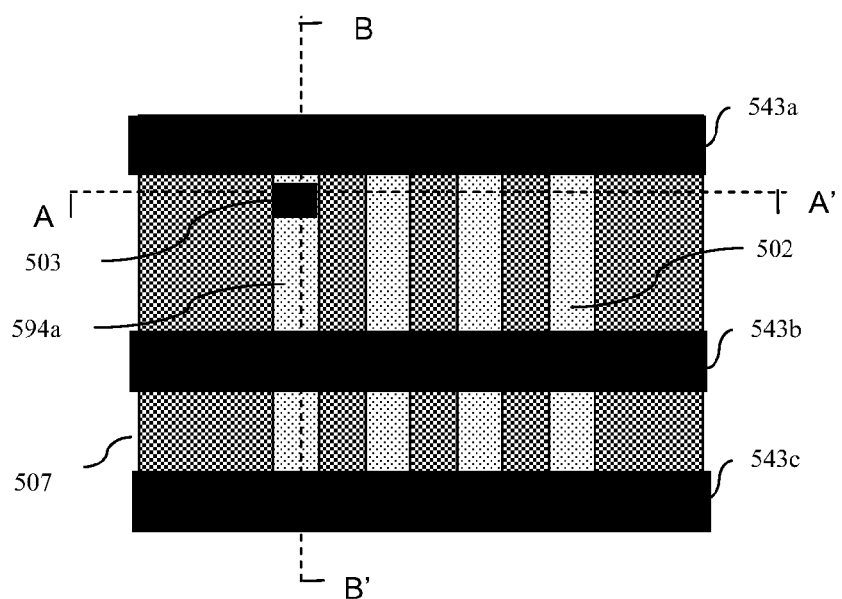
FIG. 31 is top view diagram of a semiconductor wafer illustrating another process in the method of FIG. 18.
Figure 32:
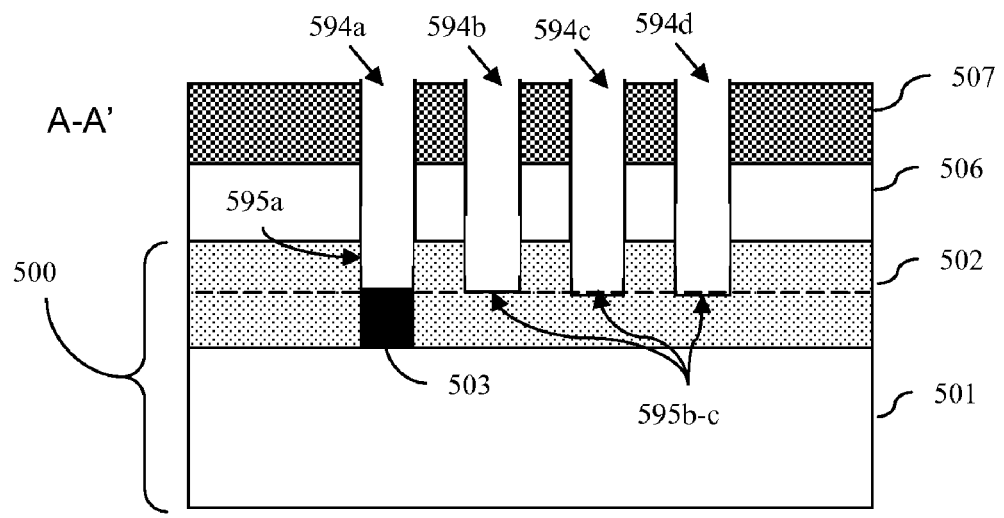
FIG. 32 is cross-section diagram A-A' of the semiconductor wafer of FIG. 31.
Figure 33:
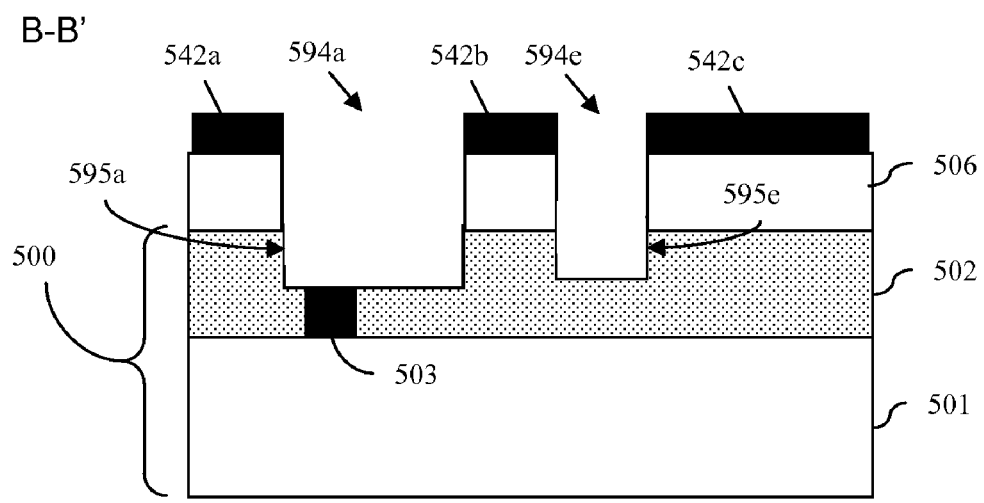
FIG. 33 is cross-section diagram B-B' of the semiconductor wafer of FIG. 31.
Figure 34:
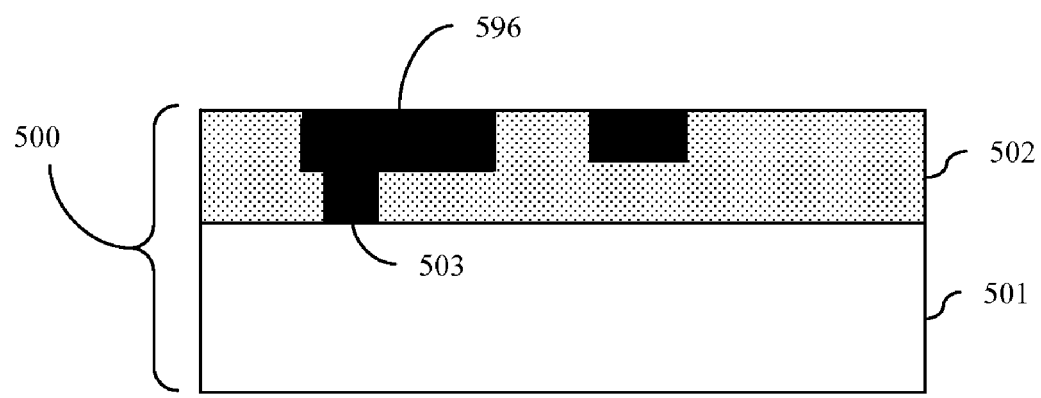
FIG. 34 is a cross-section diagram of a semiconductor wafer illustrating another process in the method of FIG. 18.

After the grid-pattern mask 293 is completed at process 406, one or more additional directional etch processes can be performed so as to transfer the pattern of the cells 594 into the substrate 500 (e.g., through another hardmask layer 506 and any interlayer dielectrics 502), thereby forming openings 595 extending into the substrate 500 and landing precisely on corresponding in-substrate structures (420, see FIGS. 31-33 in combination). Again, it should be noted that in addition to defining cell dimensions 561 and 562, the second and third lithographic processes (410-418) are tailored to ensure that the cells 594 are precisely aligned in the first and second directions 551-552 above any corresponding in-substrate structures. That is, the second and third lithographic processes (410-418) are also tailored to ensure that at least one specific cell of the grid-pattern mask is precisely aligned in both the first and second directions 551 and 552 above a corresponding specific structure in the substrate. For example, as illustrated in FIGS. 31-33, cell 594a is formed (at processes 410-418) such that one end is aligned directly one above contact 503. Thus, following a directional etch (at process 416), the opening 595a land with one end positioned directly on the contact 503. Such precise alignment is made possible because the second and third lithographic processes (410-418) are confined within the limited area 509 of the substrate 500 that is defined by the first lithographic process (408). Once the openings 595 are formed, any remaining photoresist and hardmask layers can be removed from above the substrate 500 surface and additional structures can be formed within the openings 595 (222, see FIG. 34). For example, if, as illustrated, an in-substrate structure 503 comprises a contact, then the opening 595a formed to the contact 503 (see FIGS. 31-33) can be used to form a wire interconnect 596 adjacent to the contact 503 (see FIG. 34). Alternatively, if the in-substrate structure comprises a transistor channel region, then the opening that lands on the transistor channel region can be used to form a polysilicon gate.

Therefore, disclosed above are embodiments of a lithographic patterning method that incorporates a combination of photolithography and self-assembling copolymer lithography techniques in order to create, on a substrate, a grid-pattern mask having multiple cells, each with at least one sub-50 nm dimension. The combination of different lithographic techniques further allows for precise registration and overlay of the individual grid-pattern cells with corresponding structures within the substrate. The resulting grid-pattern mask can then be used, in conjunction with directional etch and other processes, to extend the cell patterns into the substrate forming openings, with the same dimensions, that land precisely on corresponding in-substrate structures. Once the openings are formed, additional structures can be formed within the openings. For example, in one embodiment the in-substrate structures can comprise device components (e.g., transistor source/drain regions, transistor gates, etc.) and the openings can be used to form contacts on those device components. In another embodiment, the in-substrate structures can comprise contacts and the openings can be used to form wire interconnects on the contacts. In yet another embodiment, the in-substrate structures can comprise transistor channel regions and the openings can be used to form polysilicon gates on the channel regions. The sub-50 nm dimensions can be used to accommodate scaling requirements in next generation CMOS technologies and thereby will improve device density and yield.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A lithographic patterning method comprising:
providing a substrate and a structure in said substrate;
forming multiple hardmask layers on said substrate; and
performing multiple lithographic processes and etching processes, using said multiple hardmask layers, in order to create a grid-pattern mask having multiple cells, said multiple lithographic processes being tailored to ensure that one of said cells is precisely aligned above said structure, and said performing of said multiple lithographic processes comprising performing at least two discrete lithographic processes to form a first mask portion perpendicularly oriented to a second mask portion so as to create said grid-pattern mask, at least one of said two discrete lithographic processes comprising a self-assembling copolymer lithographic process.

2. The method according to claim 1, said self assembling copolymer lithographic process being tailored to ensure that at least one dimension of each of said cells is less than approximately 50 nm.

3. The method according to claim 2, said performing of said multiple lithographic processes further comprising:
performing a first lithographic process to remove a portion of a hardmask layer in order to define a limited area of said substrate that includes said structure;
performing a second lithographic process to form said first mask portion above said limited area and oriented in a first direction, said second lithographic process comprising said self-assembling copolymer lithographic process; and
performing a third lithographic process to form said second mask portion above said limited area and oriented in a second direction perpendicular to said first direction so as to create said grid-pattern mask.

4. The method according to claim 3, said third lithographic process comprising an additional self-assembling copolymer lithographic process tailored to ensure that each of said cells has a second dimension that is less than approximately 50 nm.

5. The method according to claim 3, said third lithographic process comprising a photolithographic process tailored to ensure that each of said cells has a second dimension that is greater than approximately 70 nm.

6. A lithographic patterning method, said method comprising:
providing a substrate and a structure in said substrate;
forming multiple hardmask layers on said substrate; and
performing at least three lithographic processes and multiple etching processes, using said multiple hardmask layers, in order to create a grid-pattern mask having multiple cells, said at least three lithographic processes being tailored to ensure that one of said cells is aligned above said structure, and said performing of said at least three lithographic processes comprising:
performing a first lithographic process to remove a portion of a first hardmask layer in order to define a limited area of said substrate that includes said structure, said first lithographic process comprising a photolithographic process;
performing a second lithographic process to form a first mask portion above said limited area and oriented in a first direction, said second lithographic comprising a self-assembling copolymer lithographic process; and
performing a third lithographic process to form a second mask portion above said limited area and oriented in a second direction perpendicular to said first direction so as to create said grid-pattern mask, said third lithographic process comprising an additional self-assembling copolymer lithographic process.

7. The method according to claim 6, said self-assembling copolymer lithographic process and said additional self-assembly copolymer lithographic process being tailored to ensure that dimensions of each of said cells are less than approximately 50 nm by 50 nm.

8. The method according to claim 6, said self-assembling copolymer lithographic process and said additional self-assembly copolymer lithographic process being tailored to ensure that dimensions of each of said cells are approximately 20 nm by 20 nm.

9. The method according to claim 6,
said removing of said portion of said first hardmask layer exposing a portion of a second hardmask layer between said first hardmask layer and said substrate, and
said self-assembling copolymer lithographic process comprising:
forming a periodic chemical pattern on an exposed portion of said second hardmask layer such that adjacent sections of said exposed portion have contrasting chemical functionalities, wherein said periodic chemical pattern is oriented in said first direction;
applying a copolymer mixture to said exposed portion and performing an anneal such that a periodic pattern of first polymer sections and second polymer sections is formed and is registered with and perpendicular to said periodic chemical pattern; and
selectively removing one of said first polymer sections and said second polymer sections to form said first mask portion.

10. A lithographic patterning method comprising:
providing said substrate and a structure in said substrate;
forming multiple hardmask layers on said substrate, said multiple hardmask layers comprising at least a first hardmask layer and a second hard mask layer below said first hardmask layer;
performing a first lithographic process to remove a portion of said first hardmask layer in order to expose a portion of said second hardmask layer and to define a limited area of said substrate that includes said structure;
performing a second lithographic process to form, on an exposed portion of said second hardmask layer above said limited area, a first mask portion oriented in a first direction, said second lithographic process comprising a self-assembling copolymer lithographic process;
performing a directional etch process so as to form, through said exposed portion of said second hardmask layer to said substrate, elongated trenches oriented in said first direction and having a first dimension; and
performing a third lithographic process to form, in said trenches and across said first mask portion, a second mask portion oriented in a second direction perpendicular to said first direction so as to create a grid-pattern mask having multiple cells, each with said first dimension and a second dimension, said third lithographic process comprising an additional self-assembling copolymer lithographic process,
said first lithographic process, said second lithographic process and said third lithographic process being tailored to ensure that one of said cells is aligned above said structure.

11. The method according to claim 10, said self-assembling copolymer lithographic process and said additional self-assembling copolymer lithographic process being tailored to ensure that said first dimension and said second dimension are less than approximately 50 nm.

12. The method according to claim 10, said self-assembling copolymer lithographic process and said additional self-assembling copolymer lithographic process being tailored to ensure that said first dimension and said second dimension are approximately 20 nm.

13. The method according to claim 11, said self-assembling copolymer lithographic process comprising:
- forming a periodic chemical pattern on said exposed portion of said second hardmask layer such that adjacent sections of said exposed portion have contrasting chemical functionalities, wherein said periodic chemical pattern is oriented in said first direction;
- applying a copolymer mixture to said exposed portion and performing an anneal such that a periodic pattern of first polymer sections and second polymer sections is formed and is registered with and perpendicular to said periodic chemical pattern; and
- selectively removing one of said first polymer sections and said second polymer sections to form said first mask portion.

14. The method according to claim 13, said applying of said copolymer mixture comprises applying a mixture of polystyrene (PS) and poly(methylmethacrylate) (PMMA)) such, after said performing of said anneal, said first polymer sections comprise sections of polystyrene (PS) and said second polymer sections comprise sections of poly(methylmethacrylate) (PMMA)).

15. The method according to claim 10, further comprising performing an additional directional etch process so as to form a contact hole extending through said substrate from said one of said cells to said structure.

16. A lithographic patterning method comprising:
- providing a substrate and a structure in said substrate;
- forming multiple hardmask layers on said substrate, said multiple hardmask layers comprising at least a first hardmask layer and a second hardmask layer below said first hardmask layer;
- performing a first lithographic process to remove a portion of said first hardmask layer in order to expose a portion of said second hardmask layer and to define a limited area of said substrate that includes said structure;
- performing a second lithographic process to form, on an exposed portion of said second hardmask layer above said limited area, a first mask portion oriented in a first direction; and
- performing a third lithographic process to form a second mask portion above said limited area and oriented in a second direction perpendicular to said first direction so as to create a grid-pattern mask having multiple cells,
- said first lithographic process, said second lithographic process and said third lithographic process being tailored to ensure that one of said cells is aligned with said structure,
- said second lithographic process comprising a self-assembling copolymer lithographic process tailored so that each of said cells has a first dimension that is less than approximately 50 nm, and
- said third lithographic process comprising a photolithographic process tailored to ensure that each of said cells has a second dimension that is greater than said first dimension.

17. The method according to claim 16,
- said self-assembling copolymer lithographic process being tailored such that said first dimension is less 20 nm, and
- said third lithographic process being performed such that said second dimension is greater than approximately 70 nm.

18. The method according to claim 16, said removing of said portion of said first hardmask layer exposes a portion of a second hardmask layer between said first hardmask layer and said substrate, and said self-assembling copolymer lithographic process comprising:
- forming a periodic chemical pattern in an exposed portion of said second hardmask layer such that adjacent sections of said exposed portion have contrasting chemical functionalities, said periodic chemical pattern being oriented in said first direction;
- applying a copolymer mixture to said exposed portion and performing an anneal such that a periodic pattern of first polymer sections and second polymer sections is formed and is registered with and perpendicular to said periodic chemical pattern; and
- selectively removing one of said first polymer sections and said second polymer sections to form said first mask portion.

19. A lithographic patterning method comprising:
- providing said substrate and a structure in said substrate;
- forming multiple hardmask layers on said substrate, said multiple hardmask layers comprising at least a first hardmask layer above a second hardmask layer, said second hardmask layer being above a third mask layer;
- performing a first lithographic process to remove a portion of said first hardmask layer in order to expose a portion of said second hardmask layer and to define a limited area of said substrate that includes said structure;
- performing a second lithographic process to form, on an exposed portion of said second hardmask layer above said limited area, a first mask portion oriented in a first direction, said second lithographic process comprising a self-assembling copolymer lithographic process;
- performing a directional etch process so as to form, through said exposed portion of said second hardmask layer to said third hardmask layer, elongated trenches oriented in said first direction;
- selectively removing said first mask portion; and
- performing a third lithographic process to form, in said trenches and on said second hardmask layer, a second mask portion oriented in a second direction perpendicular to said first direction so as to create a grid-pattern mask having multiple cells,
- said first lithographic process, said second lithographic process and said third lithographic process being tailored to ensure that one of said cells is aligned above said structure,
- said second lithographic process comprising a self-assembling copolymer lithographic process tailored to ensure that each of said cells has a first dimension that is less than 50 nm, and
- said third lithographic process comprising a photolithographic process tailored to ensure that each of said cells has a second dimension that is greater than said first dimension.

20. The method according to claim 19, said self-assembling copolymer lithographic process being tailored to ensure that that said first dimension is approximately 20 nm, and said photolithographic processes being tailored to ensure that said second dimension is greater than approximately 70 nm.

21. The method according to claim 20, said removing of said portion of said first hardmask layer exposing a portion of a second hardmask layer between said first hardmask layer and said substrate, and said self-assembling copolymer lithographic process comprising:
- forming a periodic chemical pattern in an exposed portion of said second hardmask layer such that adjacent sections of said exposed portion have contrasting chemical functionalities, said periodic chemical pattern being oriented in said first direction;

applying a copolymer mixture to said exposed portion and performing an anneal such that a periodic pattern of first polymer sections and second polymer sections is formed and is registered with and perpendicular to said periodic chemical pattern; and selectively removing one of said first polymer sections and said second polymer sections to form said first mask portion.

22. The method according to claim 21, said applying of said copolymer mixture comprising applying a mixture of polystyrene (PS) and poly(methylmethacrylate) (PMMA)) such, after said performing of said anneal, said first polymer sections comprise sections of polystyrene (PS) and said second polymer sections comprise sections of poly(methylmethacrylate) (PMMA)).

23. The method according to claim 21, said structure comprising comprises a channel region of a field effect transistor and said method further comprising performing an additional directional etch process so as to form an opening extending through said substrate from said one of said cells to said channel region such that a polysilicon gate structure can be formed adjacent to said channel region.

24. The method according to claim 21, said structure comprising a contact and said method further comprising performing an additional directional etch process so as to form an opening extending through said substrate from said one of said cells to said channel region such that a wire interconnect structure can be formed adjacent to said contact.

* * * * *